US010243066B2

(12) United States Patent
Schloegl et al.

(10) Patent No.: US 10,243,066 B2
(45) Date of Patent: Mar. 26, 2019

(54) PRODUCING A SEMICONDUCTOR DEVICE BY EPITAXIAL GROWTH

(71) Applicant: Infineon Technologies Austria AG, Villach (AT)

(72) Inventors: Daniel Schloegl, Villach (AT); Johannes Baumgartl, Riegersdorf (AT); Matthias Kuenle, Villach (AT); Erwin Lercher, Villach (AT); Hans-Joachim Schulze, Taufkirchen (DE); Christoph Weiss, Munich (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/589,352

(22) Filed: May 8, 2017

(65) Prior Publication Data
US 2017/0243963 A1 Aug. 24, 2017

Related U.S. Application Data

(62) Division of application No. 15/142,992, filed on Apr. 29, 2016, now Pat. No. 9,647,083.

(30) Foreign Application Priority Data

Apr. 30, 2015 (DE) .......................... 10 2015 208 097

(51) Int. Cl.
*H01L 29/74* (2006.01)
*H01L 31/111* (2006.01)
(Continued)

(52) U.S. Cl.
CPC ...... *H01L 29/7395* (2013.01); *H01L 21/0257* (2013.01); *H01L 21/0262* (2013.01);
(Continued)

(58) Field of Classification Search
CPC . H01L 29/7397; H01L 29/7395; H01L 29/36; H01L 2924/13055; H01L 29/0804
(Continued)

(56) References Cited

U.S. PATENT DOCUMENTS 5,025,293 A 6/1991 Seki
5,702,961 A * 12/1997 Park .................... H01L 29/0834
148/DIG. 126
(Continued)

FOREIGN PATENT DOCUMENTS

CN 104103682 A 10/2014
DE 102010060229 A1 5/2011
(Continued)

OTHER PUBLICATIONS

Office Action communication of the German Patent and Trademark Office for Appln. Ser. No. 102015208097.8, dated Dec. 15, 2015.
(Continued)

*Primary Examiner* — Theresa T Doan
(74) *Attorney, Agent, or Firm* — Slater Matsil, LLP

(57) ABSTRACT

A method of producing a semiconductor device is presented. The method comprises: providing a semiconductor substrate having a surface; epitaxially growing, along a vertical direction (Z) perpendicular to the surface, a back side emitter layer on top of the surface, wherein the back side emitter layer has dopants of a first conductivity type or dopants of a second conductivity type complementary to the first conductivity type; epitaxially growing, along the vertical direction (Z), a drift layer having dopants of the first conductivity type above the back side emitter layer, wherein a dopant concentration of the back side emitter layer is higher than a dopant concentration of the drift layer; and creating, either within or on top of the drift layer, a body region having dopants of the second conductivity type, a transition
(Continued)

between the body region and the drift layer forming a pn-junction (Zpn). Epitaxially growing the drift layer includes creating, within the drift layer, a dopant concentration profile (P) of dopants of the first conductivity type along the vertical direction (Z), the dopant concentration profile (P) in the drift layer exhibiting a variation of a concentration of dopants of the first conductivity type along the vertical direction (Z).

20 Claims, 13 Drawing Sheets

(51) Int. Cl.

| | |
|---|---|
| *H01L 29/739* | (2006.01) |
| *H01L 29/66* | (2006.01) |
| *H01L 29/10* | (2006.01) |
| *H01L 29/08* | (2006.01) |
| *H01L 29/06* | (2006.01) |
| *H01L 21/283* | (2006.01) |
| *H01L 21/265* | (2006.01) |
| *H01L 29/36* | (2006.01) |
| *H01L 21/02* | (2006.01) |
| *H01L 29/78* | (2006.01) |
| *H01L 29/861* | (2006.01) |
| *H01L 29/868* | (2006.01) |
| *H01L 21/266* | (2006.01) |
| *H01L 29/16* | (2006.01) |
| *H01L 29/167* | (2006.01) |
| *H01L 29/20* | (2006.01) |

(52) U.S. Cl.
CPC .......... *H01L 21/265* (2013.01); *H01L 21/283* (2013.01); *H01L 29/0634* (2013.01); *H01L 29/0688* (2013.01); *H01L 29/0804* (2013.01); *H01L 29/0834* (2013.01); *H01L 29/1095* (2013.01); *H01L 29/36* (2013.01); *H01L 29/6606* (2013.01); *H01L 29/6609* (2013.01); *H01L 29/66204* (2013.01); *H01L 29/66325* (2013.01); *H01L 29/66333* (2013.01); *H01L 29/66712* (2013.01); *H01L 29/7802* (2013.01); *H01L 29/861* (2013.01); *H01L 29/868* (2013.01); *H01L 21/266* (2013.01); *H01L 29/167* (2013.01); *H01L 29/1608* (2013.01); *H01L 29/20* (2013.01); *H01L 29/2003* (2013.01)

(58) Field of Classification Search
USPC .......................................................... 257/139
See application file for complete search history.

(56) References Cited

U.S. PATENT DOCUMENTS

| | | | |
|---|---|---|---|
| 6,274,904 | B1 | 8/2001 | Tihanyi |
| 6,285,060 | B1 * | 9/2001 | Korec ................ H01L 29/1095 257/331 |
| 6,927,103 | B2 | 8/2005 | Letavic |
| 7,250,639 | B1 | 7/2007 | Suekawa |
| 2004/0021203 | A1 * | 2/2004 | Flohrs ............... H01L 29/66333 257/578 |
| 2006/0138607 | A1 | 6/2006 | Nemoto |
| 2006/0194400 | A1 | 8/2006 | Cooper et al. |
| 2012/0088353 | A1 | 4/2012 | Willmeroth |

FOREIGN PATENT DOCUMENTS

| | | | |
|---|---|---|---|
| DE | 112010004241 | T5 | 5/2013 |
| DE | 11 2012 000 609 | T5 | 12/2014 |
| DE | 11 2013 002 178 | T5 | 12/2014 |
| DE | 11 2013 005 837 | T5 | 12/2014 |
| JP | 102196471 | A | 8/1990 |
| JP | H8-241987 | A | 9/1996 |
| JP | 2002-532886 | A | 10/2002 |
| JP | 2003-31809 | A | 1/2003 |
| JP | 2003-318412 | A | 11/2003 |
| JP | 2004-193212 | A | 7/2004 |
| JP | 2013-65735 | A | 4/2013 |
| JP | 2015-23141 | A | 2/2015 |
| KR | 20120053824 | A | 5/2012 |
| WO | WO 2014/208404 | A | 12/2014 |
| WO | 2015037101 | A1 | 3/2015 |
| WO | WO 2015/049788 | A | 4/2015 |

OTHER PUBLICATIONS

Office Action communication of the Japan Patent and Trademark Office for Appln. Ser. No. 2016-090310 including translation, dated Sep. 5, 2017.

* cited by examiner

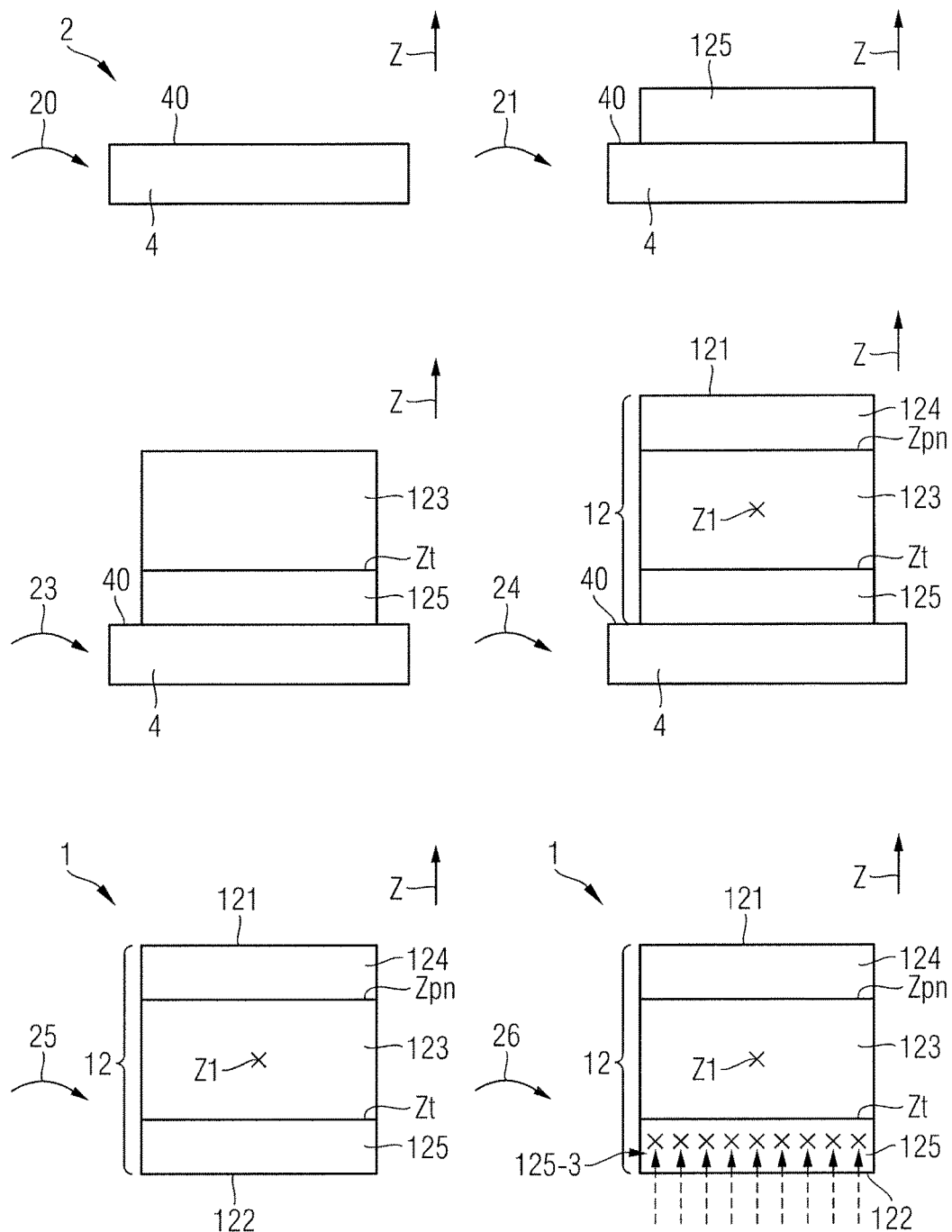

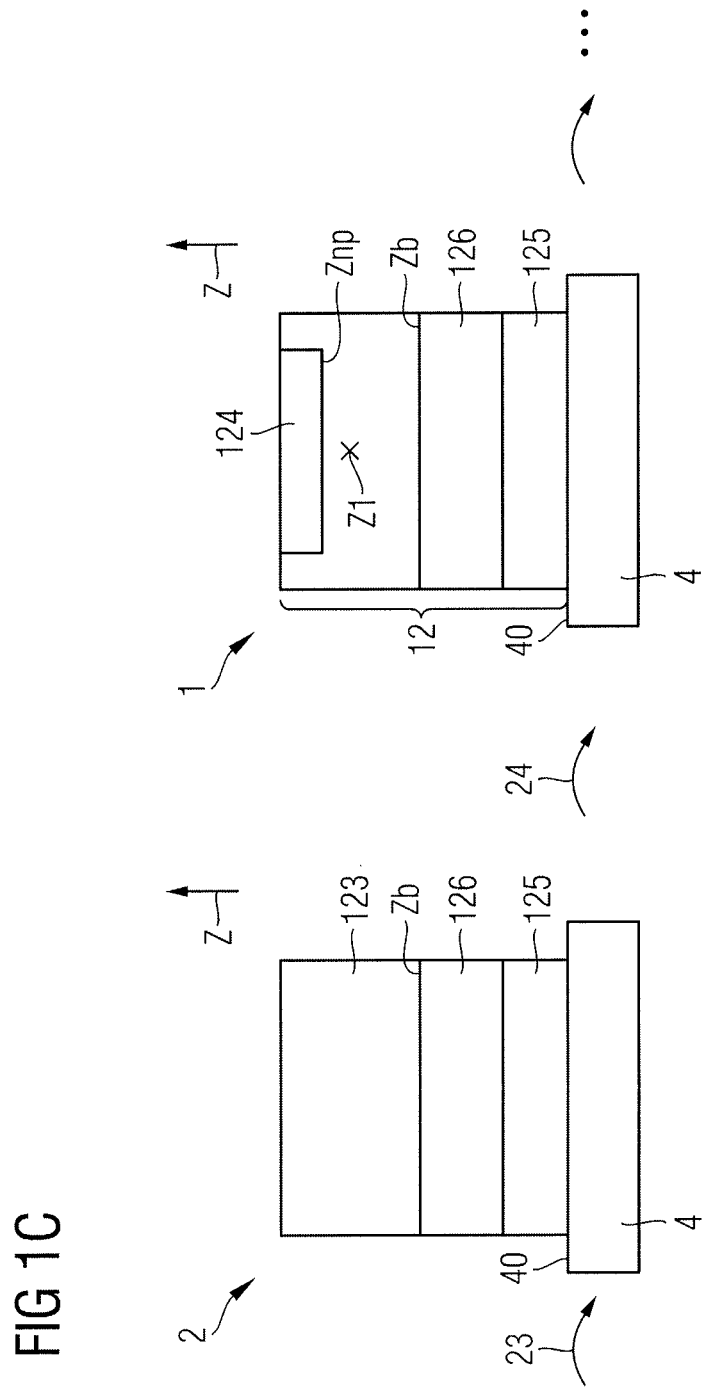

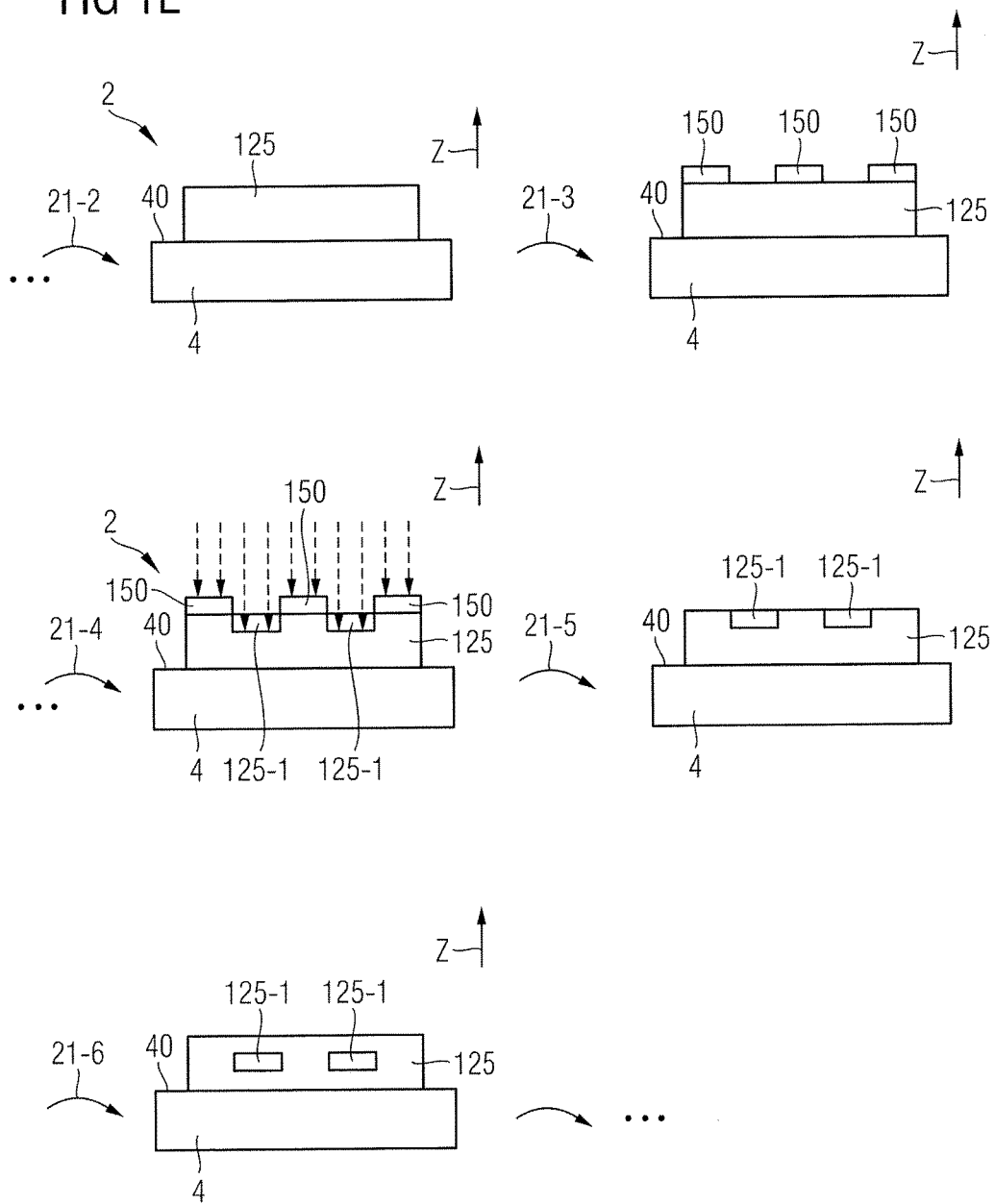

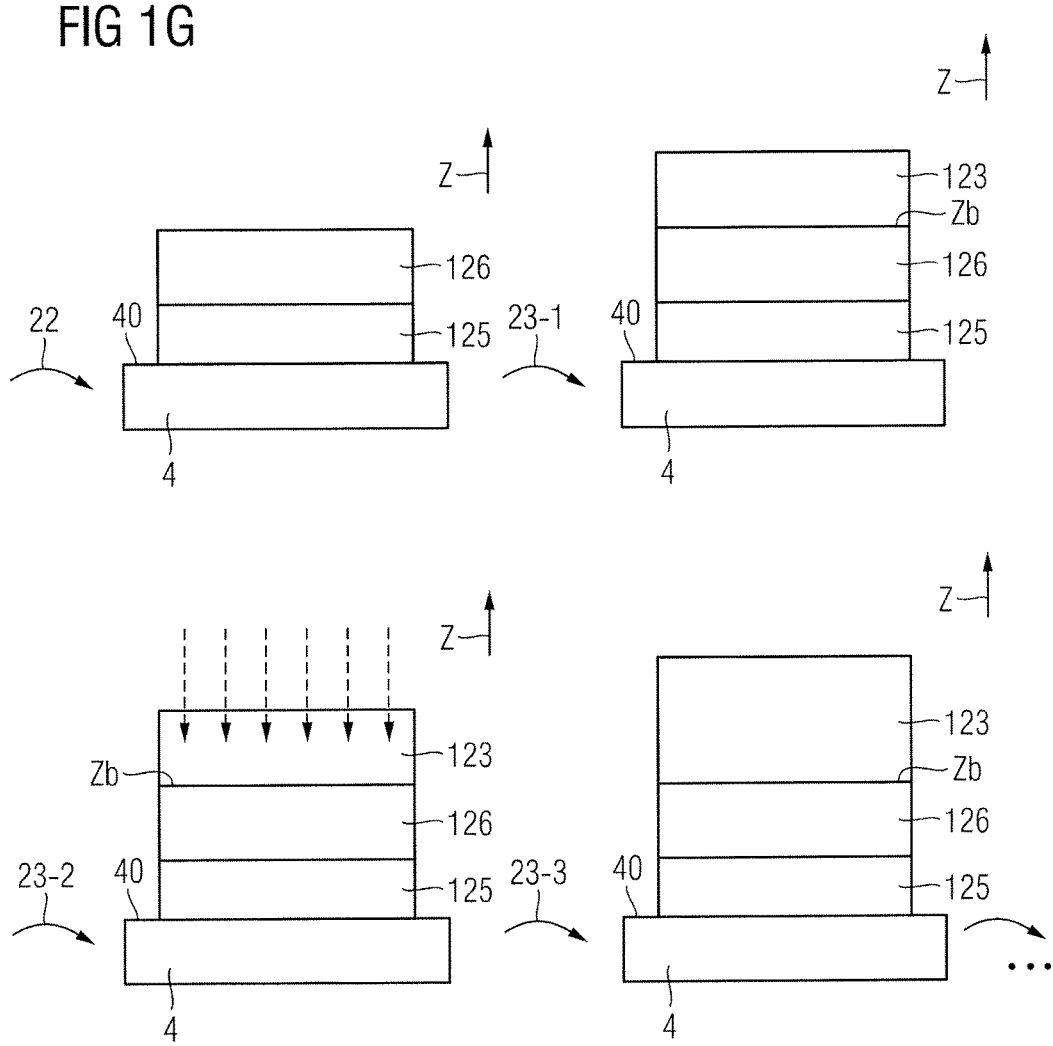

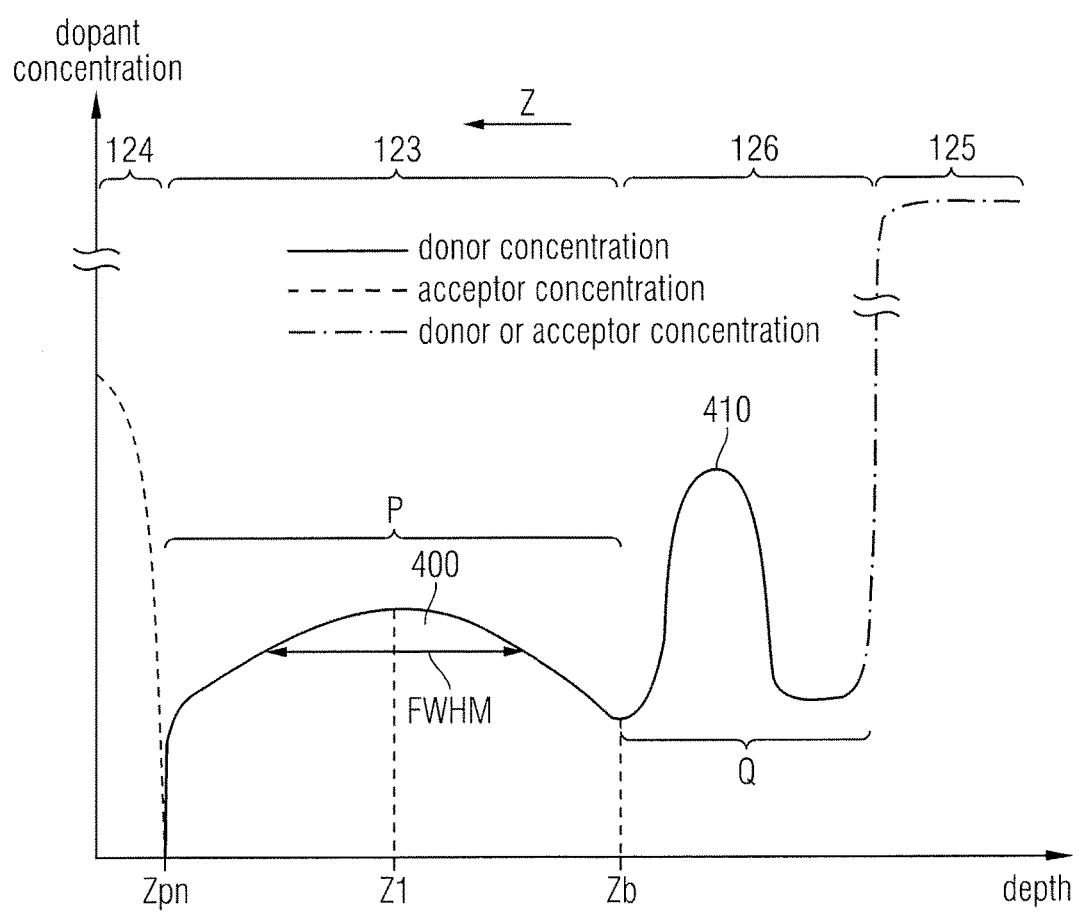

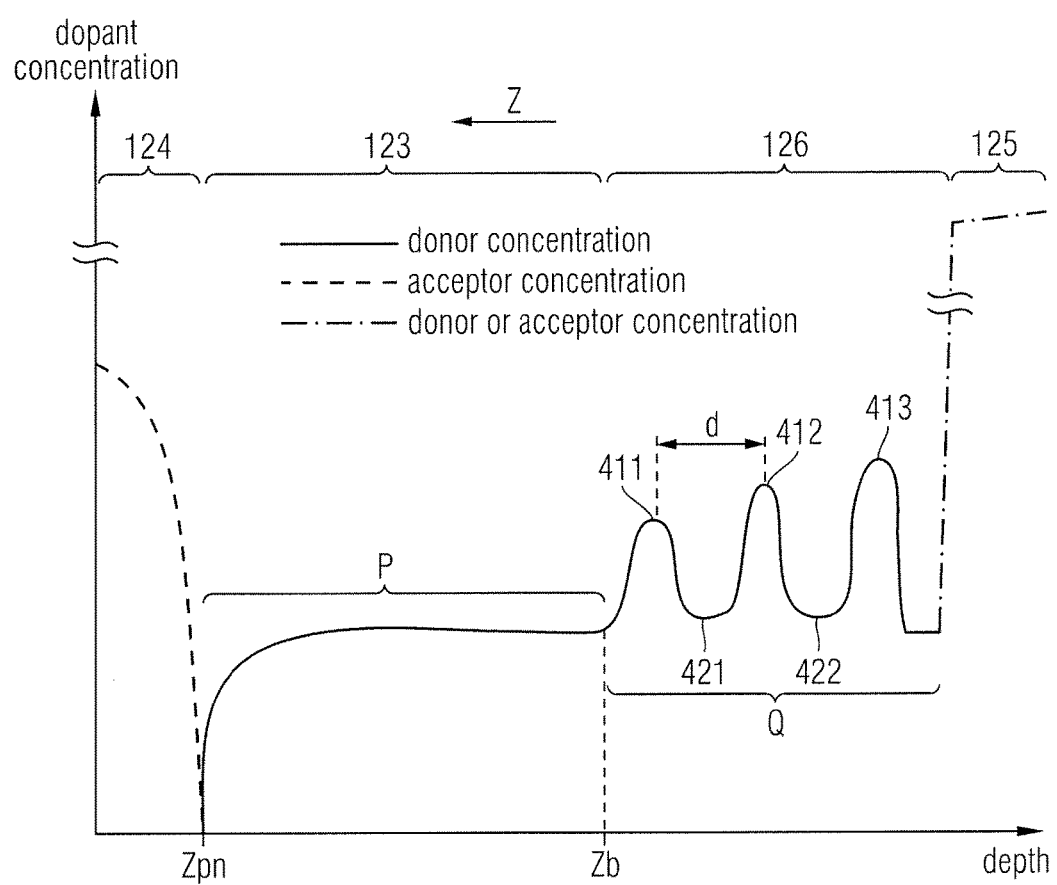

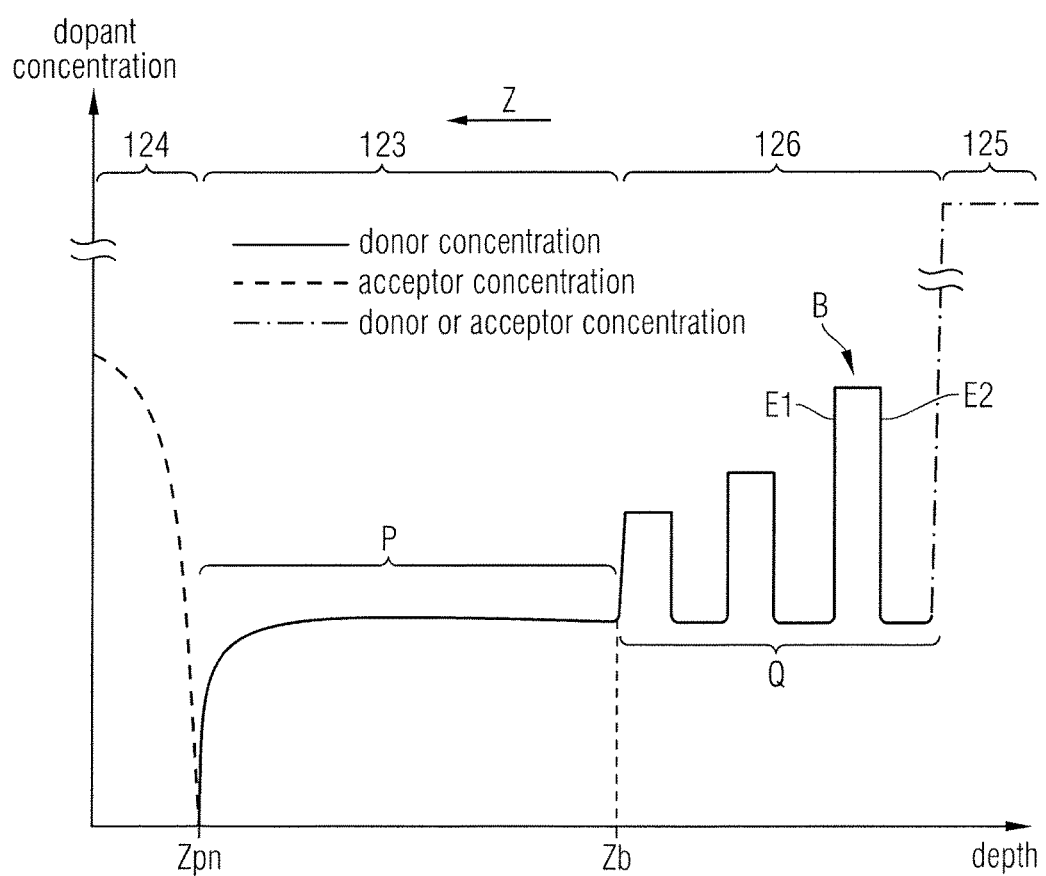

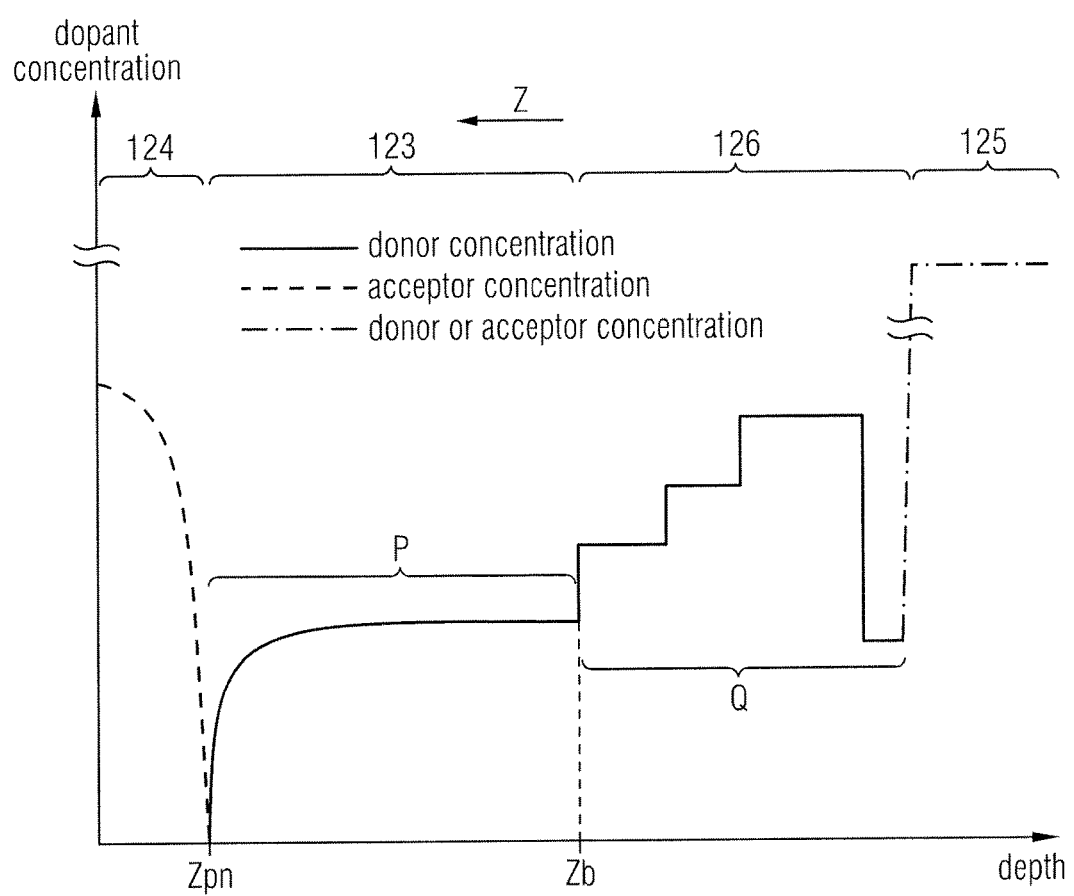

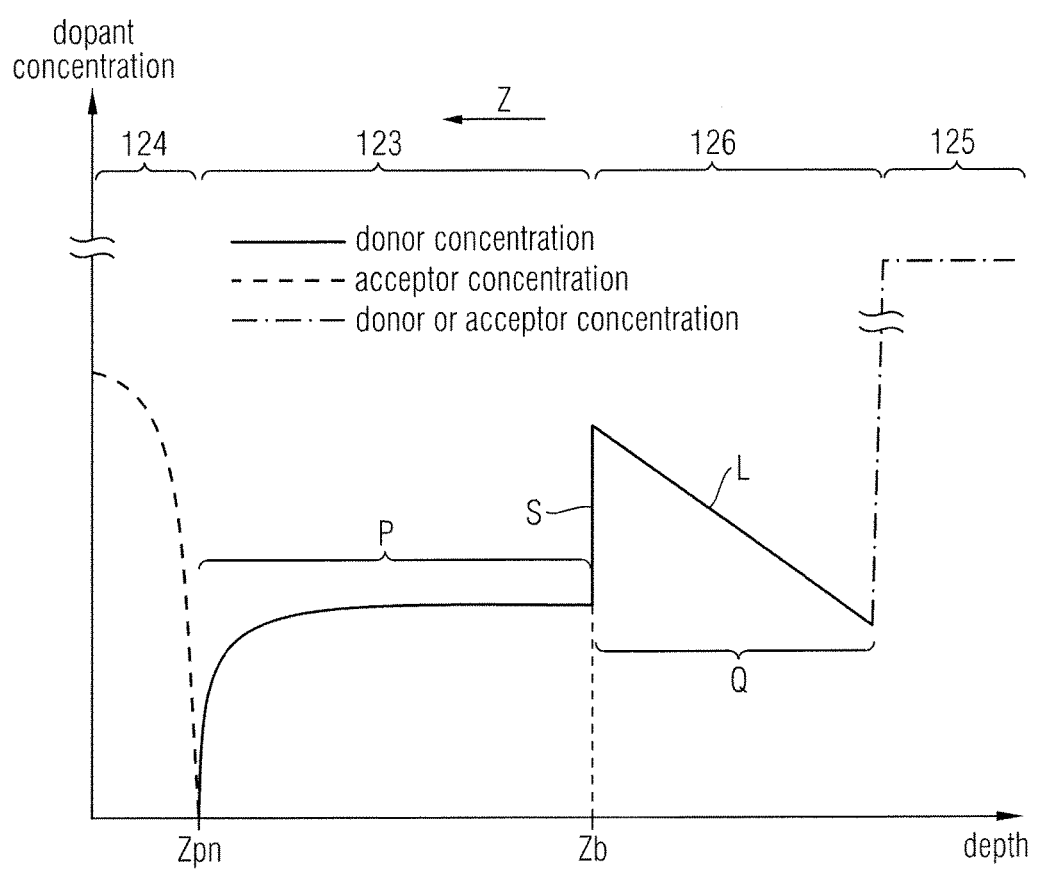

PRODUCING A SEMICONDUCTOR DEVICE BY EPITAXIAL GROWTH

CROSS-REFERENCE TO RELATED APPLICATION

This application is a divisional of U.S. application Ser. No. 15/142,992 filed Apr. 29, 2016 and entitled "Producing a Semiconductor Device by Epitaxial Growth" which claims priority to German Application Serial No. 102015208097.8 filed Apr. 30, 2015 and entitled "Producing a Semiconductor Device by Epitaxial Growth".

TECHNICAL FIELD

This specification refers to embodiments of a method of producing a semiconductor device and to embodiments of a semiconductor device. In particular, this specification refers to embodiments of a method of producing a semiconductor device by epitaxial growth of semiconductor layers.

BACKGROUND

Many functions of modern devices in automotive, consumer and industrial applications, such as converting electrical energy and driving an electric motor or an electric machine, rely on semiconductor devices. For example Insulated Gate Bipolar Transistors (IGBTs), Metal Oxide Semiconductor Field Effect Transistors (MOSFETs) and diodes have been used for various applications including, but not limited to switches in power supplies and power converters.

Often, it is desirable to provide such power semiconductor devices with a soft switch-off behavior, i.e., to avoid, for example, a too early or too sudden break-down of the reverse recovery current during switch-off of a power semiconductor diode. At the same time, it is generally desirable to minimize the switching losses of power semiconductor devices.

Such characteristics of a power semiconductor device can, e.g., be relevant for hard switching applications operating at high switching frequencies.

SUMMARY

According to an embodiment, a method of producing a semiconductor device is presented. The method comprises: providing a semiconductor substrate having a surface; epitaxially growing, along a vertical direction perpendicular to the surface, a back side emitter layer on top of the surface, wherein the back side emitter layer has dopants of a first conductivity type or dopants of a second conductivity type complementary to the first conductivity type; epitaxially growing, along the vertical direction, a drift layer having dopants of the first conductivity type above the back side emitter layer, wherein a dopant concentration of the back side emitter layer is higher than a dopant concentration of the drift layer; and creating, either within or on top of the drift layer, a body region having dopants of the second conductivity type, a transition between the body region and the drift layer forming a pn-junction. Epitaxially growing the drift layer includes creating, within the drift layer, a dopant concentration profile of dopants of the first conductivity type along the vertical direction, the dopant concentration profile in the drift layer exhibiting a variation of a concentration of dopants of the first conductivity type along the vertical direction.

According to a further embodiment, a further method of producing a semiconductor device is presented. The further method comprises: providing a semiconductor substrate having a surface; epitaxially growing, along a vertical direction perpendicular to the surface, a back side emitter layer on top of the surface, wherein the back side emitter layer has dopants of a first conductivity type or dopants of a second conductivity type complementary to the first conductivity type; epitaxially growing, along the vertical direction, a buffer layer on top of the back side emitter layer, the buffer layer having dopants of the first conductivity type; epitaxially growing, along the vertical direction, a drift layer having dopants of the first conductivity type on top of the buffer layer, wherein each of a dopant concentration of the back side emitter layer and a dopant concentration of the buffer layer is higher than a dopant concentration of the drift layer; and creating, either within or on top of the drift layer, a body region having dopants of the second conductivity type, a transition between the body region and the drift layer forming a pn-junction. Epitaxially growing the buffer layer includes creating, within the buffer layer, a dopant concentration profile of dopants of the first conductivity type along the vertical direction, the dopant concentration profile in the buffer layer exhibiting a variation of a concentration of dopants of the first conductivity type along the vertical direction.

According to yet a further embodiment, a semiconductor device is presented. The semiconductor device includes a semiconductor body having a front side and a back side, the semiconductor body extending in a vertical direction pointing from the back side to the front side and comprising: an epitaxially grown drift layer having dopants of a first conductivity type; a body region arranged either within or on top of the drift layer and having dopants of a second conductivity type complementary to the first conductivity type, a transition between the body region and the drift layer forming a pn-junction; and an epitaxially grown back side emitter layer arranged in between the drift layer and the back side, the back side emitter layer having dopants of the first or the second conductivity type and a higher dopant concentration than the drift layer. In the drift layer, a dopant concentration profile along the vertical direction exhibits a variation of a concentration of dopants of the first conductivity type along the vertical direction.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 1A schematically illustrates a method of producing a semiconductor device according to one or more embodiments;

FIG. 1C schematically illustrates a method of producing a semiconductor device according to one or more embodiments;

FIG. 1E schematically illustrates a method of producing a semiconductor device according to one or more embodiments;

FIG. 1G schematically illustrates a method of producing a semiconductor device according to one or more embodiments;

FIG. 2 schematically illustrates a section of a vertical dopant concentration profile of a semiconductor device according to one or more embodiments;

FIG. 3A schematically illustrates a section of a vertical dopant concentration profile of a semiconductor device according to one or more embodiments;

FIG. 3B schematically illustrates a section of a vertical dopant concentration profile of a semiconductor device according to one or more embodiments;

FIG. 3C schematically illustrates a section of a vertical dopant concentration profile of a semiconductor device according to one or more embodiments;

FIG. 3D schematically illustrates a section of a vertical dopant concentration profile of a semiconductor device according to one or more embodiments;

DETAILED DESCRIPTION

Figure 1B:
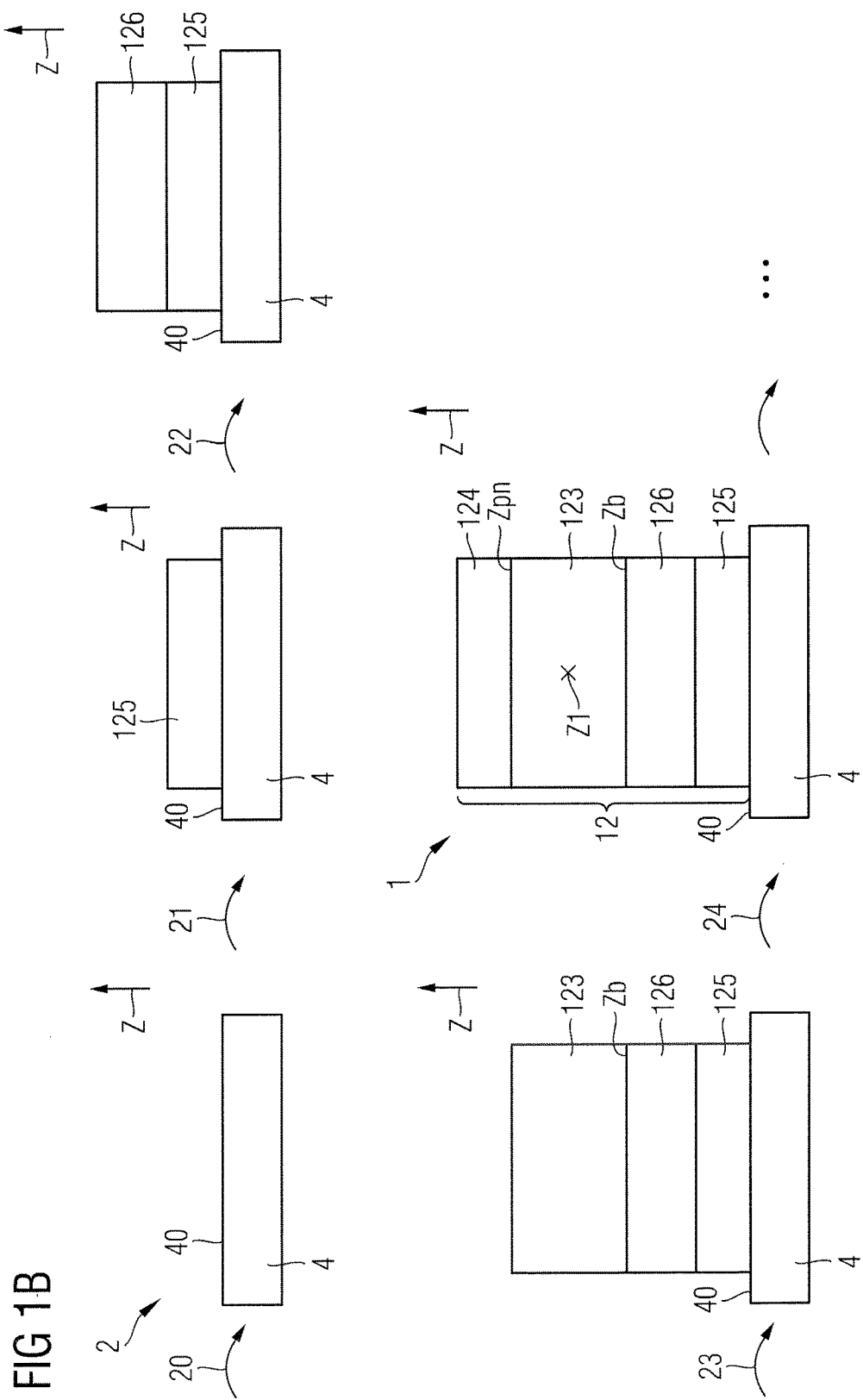
FIG. 1B schematically illustrates a method of producing a semiconductor device according to one or more embodiments.

In the following detailed description, reference is made to the accompanying drawings which form a part hereof and in which are shown by way of illustration of specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a wafer or a die.

The term "vertical" as used in this specification intends to describe an orientation which is substantially arranged perpendicular to the horizontal surface, i.e., parallel to the normal direction of the surface of the semiconductor substrate or semiconductor region.

In this specification, n-doped may be referred to as "first conductivity type" while p-doped may be referred to as "second conductivity type". Alternatively, opposite doping relations can be employed so that the first conductivity type can be p-doped and the second conductivity type can be n-doped. For example, an n-doped semiconductor region can be produced by inserting donors into a semiconductor region. Further, a p-doped semiconductor region can be produced by inserting acceptors into a semiconductor region.

In the context of the present specification, the terms "in ohmic contact", "in electric contact", "in ohmic connection", and "electrically connected" intend to describe that there is a low ohmic electric connection or low ohmic current path between two regions, sections, portions or parts of a semiconductor arrangement or between different terminals of one or more devices or between a terminal or a metallization or an electrode and a portion or part of a semiconductor arrangement. Further, in the context of the present specification, the term "in contact" intends to describe that there is a direct physical connection between two elements of the respective semiconductor arrangement; e.g., a transition between two elements being in contact with each other may not include a further intermediate element or the like.

Specific embodiments described in this specification pertain to, without being limited thereto, monolithically integrated semiconductor arrangements having an IGBT, MOSFET or diode structure.

The term "power semiconductor device" as used in this specification intends to describe a semiconductor device on a single chip with high voltage blocking and/or high current-carrying capabilities. Such semiconductor device may be part of a semiconductor arrangement. In other words, said power semiconductor devices are intended for high current, such as in the Ampere range, e.g., up to several hundred Ampere, and/or high voltages, such as above 40 V, 100 V and above.

Further, within this specification, the term "dopant concentration" may refer to an integral dopant concentration or, respectively, to a mean dopant concentration or to a sheet charge carrier concentration of a specific semiconductor region or semiconductor layer.

Thus, e.g., a statement saying that a dopant concentration of a specific semiconductor region is higher or lower as compared to a dopant concentration of another semiconductor region may indicate that the respective mean dopant concentrations of said semiconductor regions differ from each other.

Further, within this specification, the term "body region" is not necessarily limited to a body region in a transistor cell, such as a body region of a MOSFET or of an IGBT, but can also refer to an emitter region of a diode, which may form a pn-junction with a drift region of said diode. For example, the term "body region" as used in the following, may designate a p-doped (anode) emitter region of a pin-diode.

FIG. 1 schematically illustrates a method 2 of producing a semiconductor device 1 according to one or more embodiments. The method 2 comprises, in a first step 20, providing a semiconductor substrate 4 having a surface 40. For example, the semiconductor substrate 4 is a semiconductor wafer. The semiconductor wafer may be produced, for instance, by a Czochralski method, a Magnetic Czochralski method, or a zone melting method. For instance, such a semiconductor wafer exhibits a diameter of 200 mm, 300 mm, or 450 mm.

As a further step 21, the method 2 may comprise epitaxially growing, along a vertical direction Z perpendicular to the surface 40, a back side emitter layer 125 on top of the surface 40. For example, epitaxially growing the back side emitter layer 125 may comprise a chemical vapor deposition (CVD) process. The epitaxially grown back side emitter layer 125 has dopants of a first conductivity type or dopants of a second conductivity type complementary to the first conductivity type.

In some embodiments, the back side emitter layer 125 may further comprise one or more island regions that may exhibit dopants of a type that is complementary to the type of the dopants being present in the remaining section of the back side emitter layer 125, which will be explained in more detail with regards to FIG. 1E and FIG. 4B.

The back side emitter layer 125 may comprise a back side emitter region of a diode or a drain region of a MOSFET to be produced by the method 2, which can be, for example $n^+$-doped. In further embodiments, the back side emitter layer 125 comprises a back side emitter region of an IGBT to be produced by the method 2, wherein the back side emitter layer 125 can be, for example, $p^+$-doped.

A dopant concentration of the back side emitter layer 125 is, for instance, in the range from $10^{17}$ cm$^{-3}$ to $1\times10^{20}$ cm$^{-3}$. Doping of the back side emitter layer 125 may be achieved, for example, by applying, during the epitaxial growth 21 of the back side emitter layer 125, doping gases, such as phosphine, hydrogen selenide or arsine for n-type doping or diborane for p-type doping within a carrier gas such as hydrogen.

A thickness of the epitaxially grown back side emitter layer 125 is, for example, in the range from 0.3 μm to 20 μm, from 0.5 μm to 5 μm, or from 1 μm to 3 μm.

For example, the substrate 4 comprises Magnetic Czochralski silicon. In an embodiment, before epitaxially growing (step 21) the back side emitter layer 125 on top of the substrate 4, the surface 40 is pre-treated with at least one of a wet oxidation process and an application of phosphoryl chloride (commonly called phosphorus oxychloride). A resulting oxide layer on the surface 40 may be removed afterwards, e.g., by a process known in the art. In this way, a reduction of the number of oxygen precipitations and/or crystal originated particles, which may influence the diffusion of dopants within the epitaxially grown back side emitter layer 125, may be achieved.

In another embodiment, the epitaxial growth 21 of the back side emitter layer 125 is followed by an implantation of dopants in the back side emitter layer 125. For example, the implanted dopants in the back side emitter layer 125 are of the conductivity type of the dopants being present within the epitaxially grown emitter layer 125.

In a variant, the method 2 further comprises, before epitaxially growing (steps 22, 23) a subsequent semiconductor layer 123, 126 on top of the back side emitter layer 125, implanting dopants in the back side emitter layer 125, wherein a lateral variation of a dopant concentration of the back side emitter layer 125 is realized by at least one masked implantation process.

For example, as a result of said at least one masked implantation, a dopant concentration in the back side emitter layer 125 may vary within a horizontal plane parallel to the surface 40 between a substantially central position within the semiconductor device 1 to be produced and an outer position close to an edge of the semiconductor device 1 by a factor of at least 1.5 or 2 or even more than 5.

Such lateral variation of the dopant concentration due to the implanted dopants within the back side emitter layer 125 can be configured in different manners:

For example, the dopant concentration of the back side emitter layer 125 may gradually or discontinuously increase within the horizontal plane in the back side emitter layer 125 in a direction from the substantially central position within the semiconductor device 1 to be produced to the outer position close to the edge of the semiconductor device 1. For example, within the horizontal plane in the back side emitter layer 125, a dopant concentration at the outer position close to the edge of the semiconductor device 1 to be produced may be higher than a dopant concentration at the substantially central position within the semiconductor device 1 to be produced by a factor of at least 1.5 or 2 or even more than 5.

Alternatively, a dopant concentration of the back side emitter layer 125 may gradually or discontinuously decrease within the horizontal plane in the back side emitter layer 125 in a direction from the substantially central position within the semiconductor device 1 to be produced to the outer position close to the edge of the semiconductor device 1 to be produced. For example, within the horizontal plane in the back side emitter layer 125, a dopant concentration at the outer position close to the edge of the semiconductor device 1 to be produced may be lower than a dopant concentration at the substantially central position within the semiconductor device 1 to be produced by a factor of at least 1.5 or 2 or even more than 5. For example, such a reduction of the back side emitter 125 dopant concentration may be provided in a region below a blocking junction termination to be realized on the front side 121 of the chip 12 and additionally or alternatively in a region within a transition range between this area below the blocking junction termination and an active area of the semiconductor device 1 to be produced. For example, a lateral extent of such a region of reduced dopant concentration within the backside emitter layer 125 corresponds to more than 20% of a diffusion length L of minority carriers or even more than 50%, or even more than 100%, or even more than 200% of said diffusion length L.

For example, a lateral variation (i.e., a variation in a direction in parallel to said surface 40) of a dopant concentration inside the back side emitter layer 125 is achieved via a first dopant implantation followed by a second dopant implantation, wherein, during the first dopant implantation, portions of the back side emitter layer 125 can be covered by a mask (not illustrated in FIG. 1A).

For example, the semiconductor device 1 to be produced is an IGBT, wherein the back side emitter region 125 can be p-doped and may exhibit a reduced dopant concentration underneath an edge termination as compared to a dopant concentration of an active area, so as to improve a dynamic robustness of the IGBT. Alternatively or additionally, small highly p-doped regions may be implanted in the back side emitter layer 125 in the active area of the IGBT by means of such a masked implantation. The small highly p-doped regions may improve the short circuit robustness of the IGBT. Furthermore, larger highly p-doped areas may be implanted in the back side emitter layer 125 in the active area of the IGBT, e.g., in order to improve the softness of the turn-off process.

As a further step 23, the method 2 according to the embodiment illustrated in FIG. 1 may comprise epitaxially growing, along the vertical direction Z, a drift layer 123 having dopants of the first conductivity type on top of the back side emitter layer 125, wherein a dopant concentration of the back side emitter layer 125 is higher than a dopant concentration of the drift layer 123.

For example, the drift layer 123 comprises a drift zone, such as an n⁻-doped drift zone of a pin-diode, an IGBT or a MOSFET to be produced by the method 2.

For example, the drift zone 123 is configured to conduct a load current during a conducting state (on-state) of the semiconductor device 1 to be produced. Such load current may flow, e.g., in a direction substantially in parallel to the vertical direction Z.

According to an embodiment, a dopant concentration of the back side emitter layer 125 may be higher than a dopant concentration of the drift layer 123 by a factor of at least 100. This factor can be even greater than 100, for example greater than 500, or greater than 1000. For example, epitaxially growing (step 23) the drift layer 123 may comprise a CVD process.

Epitaxially growing (step 23) the drift layer 123 may include creating a dopant concentration profile P of dopants of the first conductivity type along the vertical direction Z, wherein the dopant concentration profile P exhibits a variation of a concentration of dopants of the first conductivity type along the vertical direction Z. An example of such dopant concentration profile P is schematically illustrated in FIG. 2, to which it is also referred in the following.

For example, the dopant concentration profile P in the drift layer 123 exhibits a variation of the dopant concentration by a factor of at least 2. This factor can be even greater than 2, for example greater than 5, or greater than 10. In an embodiment, the dopant concentration profile P in the drift layer 123 exhibits a maximum 400. As depicted in FIG. 2, the maximum 400 of the dopant concentration profile P can be located inside the drift layer 123. The concentration profile P can comprise a gradually increasing section and a gradually decreasing section, wherein the maximum 400 can be located at a transition from the gradually increasing section to the gradually decreasing section. As illustrated by FIG. 2, the dopant concentration profile P can comprise a section resembling a profile of a turtle shell. In a further embodiment, the dopant concentration profile P can include a substantially Gaussian-shaped section exhibiting a maximum 400.

In an embodiment, creating the dopant concentration profile P by epitaxially growing (step 23) the drift layer 123 comprises a time dependent admixture of dopants during the epitaxial process. For example, at least one of phosphorus, arsenic, and antimony dopants may be admixed from the gas phase in a time-dependent manner during the epitaxial process.

As a further step 24, the method 2 in accordance with the embodiment illustrated in FIG. 1A comprises creating, on top of the drift layer 123, a body region 124 having dopants of the second conductivity type. For instance, the body region 124 comprises a p-doped anode region 124 of a pin-diode or a p-body region 124 of an n-channel IGBT or of an n-channel MOSFET to be produced by the method 2. A transition between the body region 124 and the drift layer 123 may form a pn-junction Zpn (see also FIG. 2). For example, in the semiconductor device 1 to be produced, the pn-junction Zpn is configured to block a voltage with a space charge region extending into the body region 124 and the drift zone 123. Said voltage may amount to, e.g., at least 40 V, to at least 100 V, to least 1200 V or may even be above 1200 V.

Creating (step 24) the body region 124 may comprise, for example, epitaxially growing the body region 124 on top of the drift layer 123 along the vertical direction Z. For instance, the semiconductor device 1 to be produced may comprise a vertical edge termination (not illustrated), which may not require a horizontal structuring of the body region 124, thus allowing for producing the body region 124 by epitaxial growth. For example, the body region 124 can exhibit an acceptor concentration of at least $10^{16}$ cm⁻³, e.g., for forming a low ohmic front side contact and, at the same time, for ensuring an appropriate threshold voltage of an IGBT or for using the body region 124 as an emitter of a diode with an appropriate doping level. For example, a dopant concentration (e.g., acceptor concentration) of the body region 124 is in a range from $5 \times 10^{16}$ cm⁻³ to $2 \times 10^{17}$ cm⁻³.

Alternatively, as illustrated in FIG. 10, creating (step 24) the body region 124 can comprise at least one of a masked implantation and a diffusion of dopants of the second conductivity type into the drift layer 123. In this manner, a body region 124 in the form of a well may be formed inside the drift layer 123. For example, the body region 124 may comprise a p-well region 124 of a pin-diode, of an n-channel IGBT, or of an n-channel MOSFET to be produced by method 2.

In an embodiment, a maximum of the dopant concentration profile P in the drift region 123 is higher than a concentration of dopants of the first conductivity type at the pn-junction Zpn by a factor of at least 2.

In a further embodiment, a maximum of the dopant concentration profile P is located closer to a central position Z1 between the pn-junction Zpn and a transition Zt between the back side emitter layer 125 and the drift layer 123 than to the pn-junction Zpn and to said transition Zt. For example, the maximum of the dopant concentration profile P may be located in the vicinity of the center of total extension of the drift layer 123 along the vertical direction Z. In other words, both the distance between Z1 and Zpn and the distance between Z1 and Zt can each be greater than a distance between Z1 and said center of the drift layer.

In yet a further embodiment, a full width at half maximum (FWHM) of the dopant concentration profile P in the drift region 123 amounts to at least 20% of a distance Zt–Zpn between the pn-junction Zpn and the transition Zt between the back side emitter layer 125 and the drift layer 123.

In an embodiment, the method 2 may further comprise a step 25 of removing the semiconductor substrate 4, e.g., by using a process known in the art. Thereby, a back side 122 of the semiconductor body 12 can be exposed at least partially. This is illustrated in FIG. 1A. For example, the semiconductor substrate 4 may be removed using at least one of a grinding process, a polishing process, and a chemical-mechanical planarization process. In a variant, removing (step 25) the semiconductor substrate 4 may include removing a portion of the back side emitter layer 125.

In a further embodiment, the method 2 comprises, subsequently to removing the semiconductor substrate 4, implanting (step 26) dopants in the back side emitter layer 125 (see dashed arrows in FIG. 1A). For example, the implanted dopants are of the conductivity type of the dopants being present within the epitaxially grown back side emitter layer 125. For example, the implantation 26 of dopants is carried out so as to allow for an improved ohmic contact at a transition between the back side emitter layer 125 and a back side metallization (not illustrated) of the semiconductor device 1 to be produced.

In another embodiment, the method 2 comprises creating (step 26) a damage region 125-3 within the back side emitter region 125, wherein a conductivity of the damage region 125-3 is lower than a conductivity of the section of the back side emitter region 125 outside the damage region 125-3. In other words, the created damage region 125-3 can be configured for reducing a lifetime and/or a mobility of charge carriers in the damage region 125-3 as compared to a lifetime and/or a mobility of charge carriers in the section of the back side emitter region 125 outside the damage region 125-3. Thereby, an emitter efficiency of the back side emitter region 125 can be reduced. Creating the damage region 125-3 may comprise an implantation process, e.g., from the back side 122. For example, at least one of argon, phosphorus, antimony, and arsenic is implanted in the back side emitter region 125 in order to create the damage region 125-3.

Thus, the method 2 of producing a semiconductor device 1 may further comprise, subsequently to removing (step 25) the semiconductor substrate 4, at least one of: implanting (step 26) dopants in the back side emitter layer 125 from the back side 122 and creating (step 26) a damage region 125-3 within the back side emitter region 125, wherein a conductivity of the damage region 125-3 is lower than a conductivity of the section of the back side emitter region 125 outside the damage region 125-3.

In a variant of the method 2 of producing a semiconductor device, as illustrated in FIG. 1B, the method 2 further comprises epitaxially growing (step 22), along the vertical direction Z, a buffer layer 126 on top of the back side emitter layer 125 before epitaxially growing 23 the drift layer 123 on top of the buffer layer 126. The buffer layer 126 may have dopants of the first conductivity type, and a dopant concentration of the buffer layer 126 is higher than a dopant concentration of the drift layer 123. In an embodiment, a maximal dopant concentration of the buffer layer 126 is higher than a maximal dopant concentration of the drift layer 123 by a factor of at least 2. Except for the buffer layer 126, the embodiment of the method 2 in accordance with FIG. 1B may be carried out in manner substantially identical to the manner of carrying out the embodiment of the method 2 exemplarily illustrated in FIG. 1A.

Further, similar to the embodiment already explained with respect to FIG. 1A and to FIG. 2, a maximum 400 of the dopant concentration profile P may be located closer to said central position Z1 between the pn-junction Zpn and a transition Zb between the buffer layer 126 and the drift layer 123 than to the pn-junction Zpn and to said transition Zb between the back side buffer layer 126 and the drift layer 123, as illustrated in FIG. 2. For example, the maximum 400 of the dopant concentration profile P may be located in the vicinity of the center of total extension the drift layer 123 along the vertical direction Z. In other words, both the distance between Z1 and Zpn and the distance between Z1 and Zb can each be greater than a distance between Z1 and said center of the drift layer.

In yet a further embodiment, a full width at half maximum (FWHM) of the dopant concentration profile P in the drift region 123 amounts to at least 20% of a distance Zb-Zpn between the pn-junction Zpn and a transition Zb between the buffer layer 126 and the drift layer 123, see FIG. 2.

In accordance with the embodiment of the method 2 schematically illustrated in FIG. 1B, each of a dopant concentration of the back side emitter layer 125 and a dopant concentration of the buffer layer 126 may be higher than a dopant concentration of the drift layer 123. Further, epitaxially growing (step 22) the buffer layer 126 may include creating a dopant concentration profile Q of dopants of the first conductivity type along the vertical direction Z, the dopant concentration profile Q exhibiting a variation of a concentration of dopants of the first conductivity type along the vertical direction Z.

The buffer layer 126 may be configured to avoid a punch-through of an electric field to the back side emitter region 123 in a blocking state of the semiconductor device 1 to be produced.

In an embodiment, creating the dopant concentration profile Q by epitaxially growing (step 22) the buffer layer 126 may comprise a time dependent admixture of dopants during the epitaxial process, such as, for example, at least one of phosphorus, arsenic and antimony dopants.

For example, in accordance with the embodiment of the method 2 explained above with respect to FIG. 1B, at least the process steps 21, 22, 23, 24 of epitaxially growing the back side emitter layer 125, the buffer layer 126, the drift layer 123, and the body region 124 may be carried out sequentially within a single deposition process. Variations in dopant types and or dopant concentrations between the respective layers 123, 124, 125, 126 can be realized, for instance, by the time dependent admixture of dopants during the epitaxial growth of said layers 123, 124, 125, 126.

In a variant of the method 2, at least the process steps 21, 22, 23 of epitaxially growing the back side emitter layer 125, the buffer layer 126 and the drift layer 123 may be carried out sequentially within a single deposition process.

In a further variant of the method 2, at least the process steps 22, 23 of epitaxially growing the buffer layer 126 and the drift layer 123 may be carried out sequentially within a single deposition process.

In an embodiment, the dopant concentration profile Q in the buffer layer 126 may exhibit a maximum 410, as illustrated in FIG. 2, which exemplarily and schematically illustrates a section of dopant concentration profile in a vertical cross-section of a semiconductor device 1 produced with a method as depicted in FIG. 1B. Said maximum 410 may be located, e.g., in vicinity of a center of the total extension of the buffer layer 126 along said vertical direction Z. For example, the dopant concentration profile Q in the buffer layer 126 may exhibit a variation of the dopant concentration by a factor of at least 2.

As depicted in FIG. 3A, which also exemplarily and schematically illustrates a section of dopant concentration profile in a vertical cross-section of a semiconductor device 1, the dopant concentration profile Q in the buffer layer 126 may exhibit a plurality of local maxima 411, 412, 413. In the exemplary embodiment depicted in FIG. 3A, the plurality of local maxima comprises three local maxima 411, 412, 413. In other embodiments, the number of local maxima 411, 412, 413 can be two or four, or even five or more than five. For example, the local maxima 411, 412, 413 may form field stop peaks. Thus, the dopant concentration profile Q may exhibit a course similar to concentration profiles that can be produced by implantation. The local maxima 411, 412 and 413 can each be part of substantially Gaussian-shaped sections of the dopant concentration profile Q. As further depicted in FIG. 3A, the local maxima 411, 412 and 413 can differ in value (height). A distance d between two neighboring of said local maxima 411 to 413 is, for example, in the range from 2 µm to 20 µm or in the range from 3 µm to 10 µm.

For example, the dopant concentration profile Q in the buffer layer 126 can exhibit a local minimum 421 being located between the neighboring local maxima 411 and 412 and a further local minimum 422 being located between the neighboring local maxima 412 and 413, wherein a dopant concentration at the local minimum 421 is lower than the dopant concentration of the neighboring local maxima by a factor of at least 2. This factor can be even greater than 2, for example greater than 5, or greater than 10.

According to another embodiment, the dopant concentration profile Q in the buffer layer 126 exhibits at least one of a step-like increase and a step-like decrease of the dopant concentration along the vertical direction Z. For example, in accordance with the embodiment depicted in FIG. 3C, the dopant concentration profile Q comprises a stair-case section including at least three step-like increases and at least one step-like decrease along the vertical direction Z.

In the context of the present specification, the terms "step-like decrease" or, respectively "step-like increase" may refer to a course of a dopant concentration along the vertical direction Z, wherein, at a section of said course, the dopant concentration changes by a factor of at least 2 within a distance of 1 μm, and remains substantially constant within a subsequent distance of at least 2 μm. Said factor can be even greater than 2, for example greater than 5, or greater than 10.

According to yet a further embodiment that is schematically illustrated in FIG. 3B, the dopant concentration profile Q in the buffer layer 126 may comprise at least one box-shaped section B, wherein a first edge E1 of the at least one box-shaped section B is formed by a step-like increase of the dopant concentration along the vertical direction Z, and wherein a second edge E2 of the box-shaped section is formed by a step-like decrease of the dopant concentration along the vertical direction Z.

In an embodiment, the dopant concentration varies along the vertical direction Z by a factor of at least 2 over a distance of 1 μm at the step-like increase and/or at the step-like decrease of the dopant concentration profile Q. This factor can be even greater than 2, for example greater than 5, or greater than 10.

In a variant, the dopant concentration profile Q in the buffer layer 126 comprises at least one box-shaped section B. For instance, in the exemplary embodiment depicted in FIG. 3B, the dopant concentration profile Q in the buffer layer 126 comprises three box-shaped sections B. Within the dopant concentration profile Q in the buffer region 126, a plurality of box-shaped sections B can be arranged next to each other in many different ways. Thus, it is possible to approximate a variety of continuous dopant concentration profiles.

In accordance with an embodiment of the method 2, the edges E1, E2 of the box-shaped section B and/or the step-like increases or decreases within the dopant concentration profile Q may be softened by diffusion of dopants during the epitaxial growth 22 of the buffer layer 126 and/or during a subsequent high-temperature process step. In other words, the contours of a dopant concentration profile Q may be washed out to a certain extent by diffusion of dopants. For example, a dopant concentration profile Q exhibiting a plurality of substantially Gaussian-shaped peaks as illustrated in FIG. 3A may be the result of such a softening of the contours of a dopant concentration profile Q as depicted in FIG. 3B by diffusion of dopants.

In accordance with another embodiment that is schematically illustrated in FIG. 3D, the dopant concentration profile Q in the buffer layer 126 may comprise at least one substantially linear section L exhibiting one of a substantially linear increase and a substantially linear decrease of the dopant concentration along the vertical direction Z over a distance of at least 50% of the total extension of the buffer layer 126 along the vertical direction (Z), e.g., for at least 10 μm. For example, in the embodiment depicted in FIG. 3D, the dopant concentration profile Q in the buffer layer 126 exhibits a substantially linear section L exhibiting a linear decrease of the dopant concentration along at least 95% of the total extension of the buffer layer 126 along the vertical direction Z. The linear section L can start at a sharply increasing edge S located at the transition Zb between the buffer layer 126, wherein the sections S and L may form two sides of a virtual triangle.

In another embodiment, the epitaxial growth 22 of the buffer layer 126 is followed by an implantation of dopants in the buffer layer 126. For example, the implanted dopants in the buffer layer 126 are of the first conductivity type.

In a variant, the method 2 further comprises, before epitaxially growing (step 23) the drift layer 123 on top of the buffer layer 126, implanting dopants in the buffer layer 126, wherein a lateral variation of a dopant concentration of the buffer layer 126 is realized by at least one masked implantation process.

For example, as a result of said at least one masked implantation, a dopant concentration in the buffer layer 126 may vary within a horizontal plane parallel to the surface 40 between a substantially central position within the semiconductor device 1 to be produced and an outer position close to an edge of the semiconductor device 1 to be produced by a factor of at least 2, at least 5, or even more than 5.

Such lateral variation of the dopant concentration due to the implanted dopants within the buffer layer 126 can be configured in different manners:

For example, the dopant concentration of the buffer layer 126 may gradually increase within the horizontal plane in the buffer layer 126 in a direction from the substantially central position within the semiconductor device 1 to be produced to the outer position close to the edge of the semiconductor device 1. For example, within the horizontal plane in the buffer layer 126, the dopant concentration at the outer position close to the edge of the semiconductor device 1 to be produced may be higher than the dopant concentration at the substantially central position within the semiconductor device 1 to be produced by a factor of at least 2, 5, or even more than 5. For example, such an enhancement of the field stop 126 dopant concentration may be provided in a region below a blocking junction termination to be realized on the front side 121 of the semiconductor body 12 and additionally or alternatively in a region within a transition range between this area below the blocking junction termination and an active area of the semiconductor device 1 to be produced. For example, a lateral extent of such a region of enhanced dopant concentration within the buffer layer 126 corresponds to more than 20% of a diffusion length L of minority carriers or even more than 50%, or even more than 100%, or even more than 200% of said diffusion length L.

Alternatively, a dopant concentration of the buffer layer 126 may gradually decrease within the horizontal plane in the buffer layer 126 in a direction from the substantially central position within the semiconductor device 1 to be produced to the outer position close to the edge of the semiconductor device 1 to be produced. For example, within the horizontal plane in the buffer layer 126, the dopant concentration at the outer position close to an edge of the semiconductor device 1 to be produced may be lower than the dopant concentration at the substantially central position within the semiconductor device 1 to be produced by a factor of at least 2 or 5, or even more than 5.

Figure 1D:
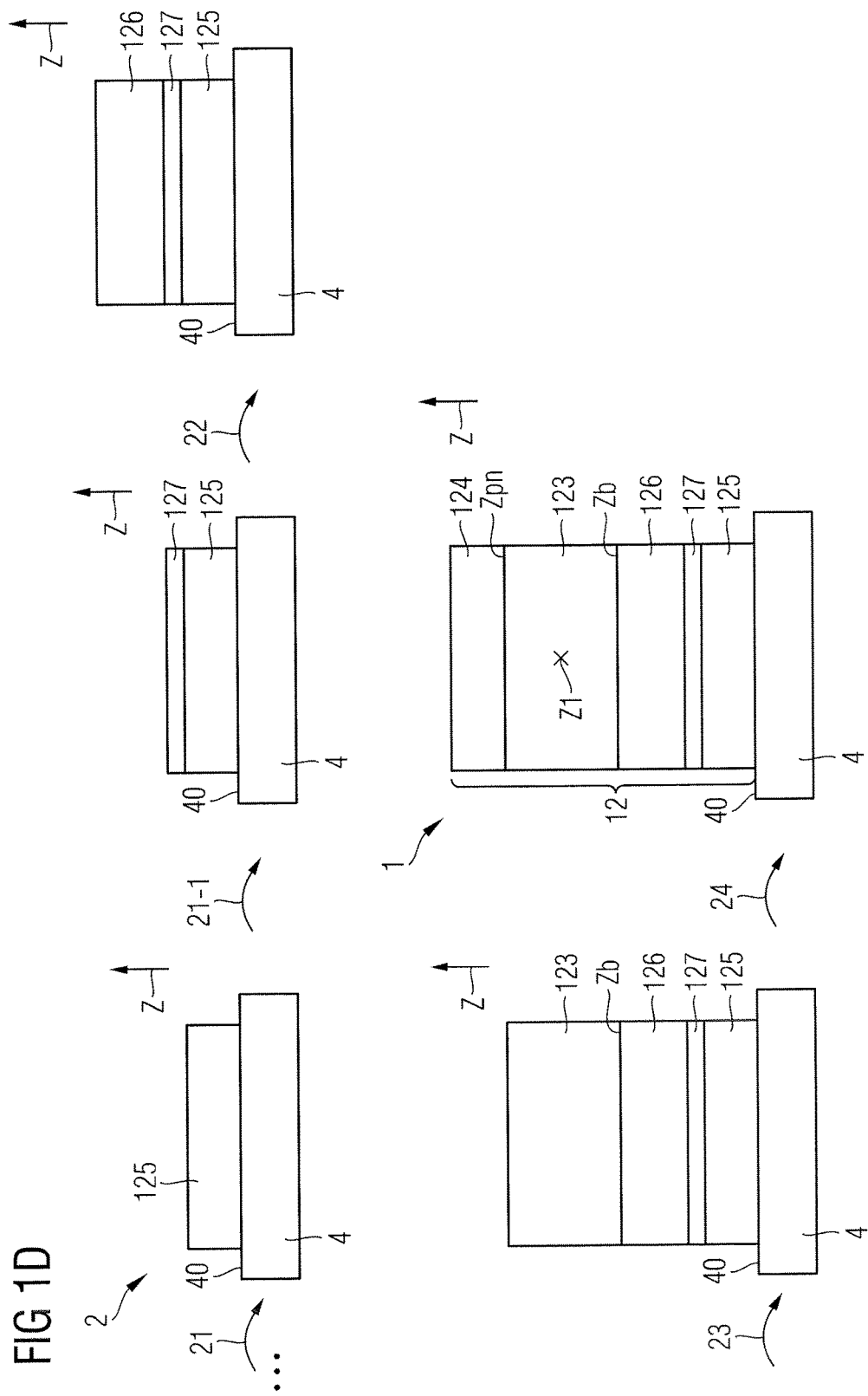
FIG. 1D schematically illustrates a method of producing a semiconductor device according to one or more embodiments.

A further variant of the methods 2 of producing a semiconductor device 1 described above is schematically and exemplary illustrated in FIG. 1D. The method 2 of producing a semiconductor device 1, may further comprise at least one of: epitaxially growing (step 21-1) a substantially undoped or lowly doped cap layer 127 on top of at least one of said epitaxially grown (steps 21, 22, 23, 24) semiconductor layers 123, 124, 125, 126 before epitaxially growing (steps 22, 23, 24) a subsequent semiconductor layer 123, 124, 126 on top of the cap layer 127; and interrupting the epitaxial growth (steps 21, 22, 23, 24) of at least one of said semiconductor layers 123, 124, 125, 126 at a point and epitaxially growing (step 21-1) such a substantially undoped or lowly doped cap layer 127 on top of a portion of said semiconductor layer 123, 124, 125, 126 that has been grown up to that point before continuing the epitaxial growth (steps 21, 22, 23, 24) of said semiconductor layers 123, 124, 125, 126.

For example, as depicted in FIG. 1D, said variant may comprise, after epitaxially growing (step 21) the back side emitter layer 125, epitaxially growing (step 21-1) such a substantially undoped or lowly doped cap layer 127 on top of the back side emitter layer 125. Subsequently, the drift layer 123 or the buffer layer 126 can be grown epitaxially (step 23) on top of the cap layer 127. The cap layer 127 can, for instance, comprise one of silicon and silicon-germanium.

For example, such a substantially undoped or lowly doped cap layer 127 may be provided by epitaxial growth after one or more interruptions of the epitaxial growth (steps 21, 22, 23, 24) of said semiconductor layers 123, 124, 125, 126.

In an embodiment, the cap layer 127 comprises amorphous silicon, which can be, e.g., recrystallized in a subsequent tempering step at relatively low temperatures in the range between 400° C. and 700° C. or between 450° C. and 600° C.

The cap layer 127 may be configured to hinder dopants from the relatively highly doped back side emitter layer 125 to enter the drift layer 123 or, respectively, the buffer layer 126.

In accordance with yet a further embodiment of the method 2 that is schematically and exemplarily illustrated in FIG. 1E, epitaxially growing (step 21) of the back side emitter layer 125 having dopants of either the first or the second conductivity type is interrupted (step 21-2) at a point. A mask 150 is then created (step 21-3) on top of a portion of the back side emitter layer 125 that has been grown up to that point. Creating the mask 150 may be achieved by lithographic methods known in the art. Said embodiment of the method 2 may further comprise creating (step 21-4), via an implantation (illustrated by dashed arrows in FIG. 1E) of dopants of a conductivity type complementary to the conductivity type of the dopants being present within the epitaxially grown back side emitter layer 125, a plurality of island regions 125-1 within the back side emitter layer 125, wherein a position, shape and extension of the island regions 125-1 in a horizontal plane may be set by the mask 150. For example, in a horizontal cross-section of the back side emitter layer 125, the island regions 125-1 may exhibit a square shape, a rectangular shape, or a strip shape.

In an embodiment, epitaxially growing (step 21) the back side emitter layer 125 may thus comprise: interrupting (step 21-2) the epitaxial growth of the back side emitter layer 125 at a point; creating (step 21-3) a mask 150 on top of a portion of the back side emitter layer 125 that has been grown up to that point; and creating (step 21-4), via an implantation of dopants of a type complementary to the conductivity type of the dopants being present within the epitaxially grown emitter layer 125, a plurality of island regions 125-1 within the back side emitter layer 125.

Subsequently to the implantation (step 21-4), the mask 150 may be removed (step 21-5), and the epitaxial growth (step 21) of the back side emitter layer 125 may be continued (step 21-6).

For example, one of boron, aluminum, and indium can be used as dopant material for the implantation 21-4 of p-doped island regions 125-1, e.g., in an n-doped back side emitter layer 125 of a diode cell.

In an embodiment, the island regions 125-1 extend through the whole back side emitter layer 125 in the vertical direction Z, thereby being in contact with the back side 122 of the semiconductor body 12. For example, for producing a reverse conducting IGBT, donor-type dopant atoms such as, e.g., phosphorus, arsenic or antimony, can be implanted. The resulting n-doped island regions 125-1 may extend through the whole p-doped back side emitter layer 125 in the vertical direction Z. Thus, the n-doped island regions 125-1 may be in contact with the back side 122 (and possibly a backside metallization to be arranged thereon), thereby functioning as n-short areas of the reverse conducting IGBT to be produced.

As explained above, the back side emitter layer 125 may be, for example, an n-doped region. In this case, the island regions 125-1 are p-doped. For example, the dopant concentration of the island regions 125-1 is higher than the dopant concentration of the back side emitter layer 125 outside the island regions 125-1 by a factor of at least 2. In a variant, the dopant concentration of the island regions 125-1 is higher than the dopant concentration of the back side emitter layer 125 outside the island regions 125-1 by a factor of at least 5 or even 10.

For example, the island regions 125-1 are configured to inject holes during switching-off of the semiconductor device. For example, the island regions 125-1 may thereby counteract against a too early or too sudden break-down of a reverse-recovery current.

Figure 1F:
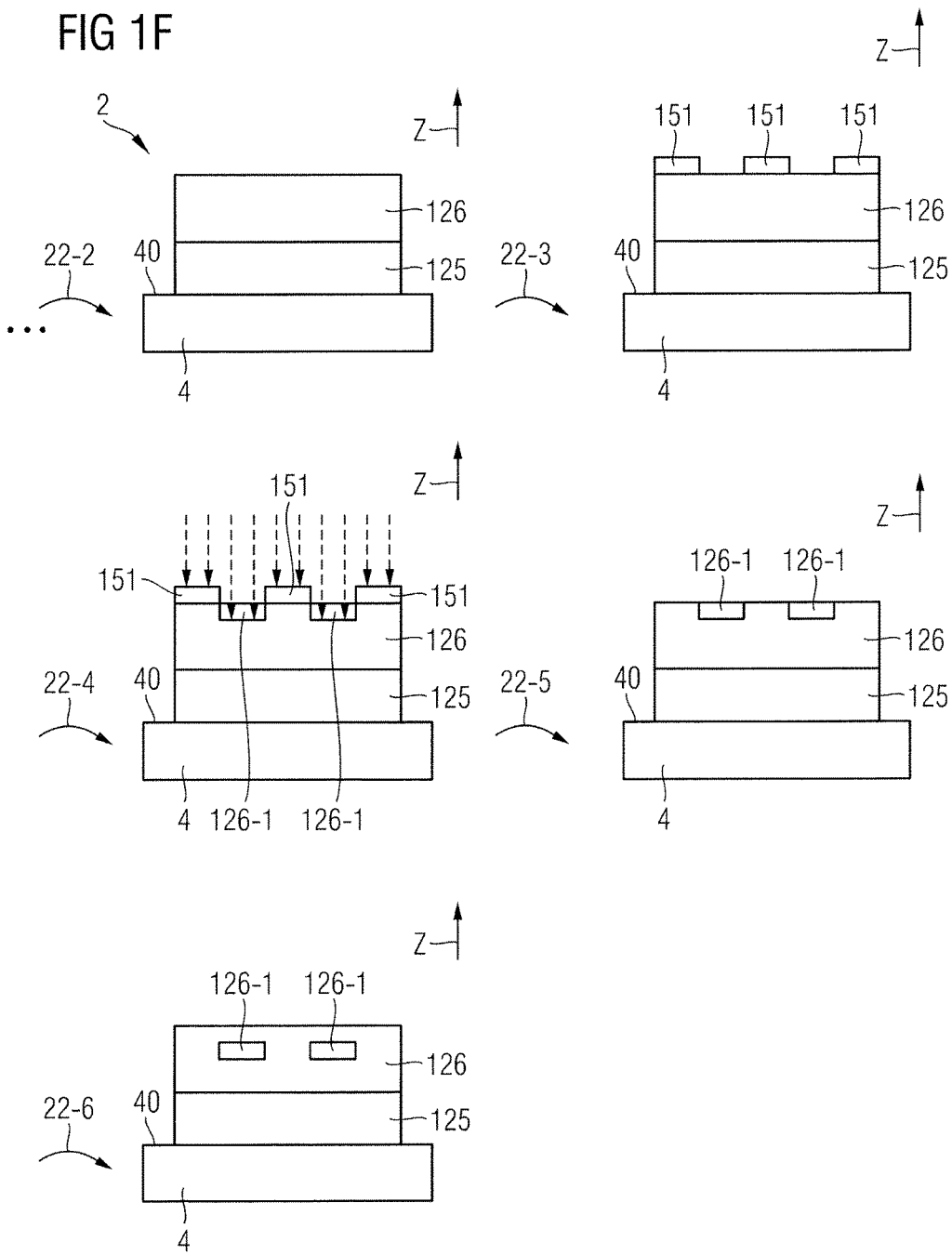
FIG. 1F schematically illustrates a method of producing a semiconductor device according to one or more embodiments.

In a further embodiment that is schematically and exemplarily illustrated in FIG. 1F, epitaxially growing (step 22) of the buffer layer 126 is interrupted (step 22-2) at a point, and a plurality of island regions 126-1 inside the buffer layer 126 are created (step 22-4) via a masked implantation according to process steps 22-2 to 22-6 that are analogous to the steps 21-2 to 21-6 described above with regards to FIG. 1E.

Thus, in said further embodiment of the method 2, epitaxially growing (step 22) of the buffer layer 126 can be interrupted (step 22-2) at a point. A mask 151 can then be created (step 22-3) on top of a portion of the buffer layer 126 that has been grown up to that point. Creating the mask 151 may be achieved by lithographic methods known in the art. Said embodiment of the method 2 may further comprise creating (step 22-4), via an implantation (illustrated by dashed arrows in FIG. 1F) of dopants of a conductivity type complementary to the conductivity type of the dopants being present within the epitaxially grown buffer layer 126, a plurality of island regions 126-1 within the buffer layer 126, wherein a position, shape and extension of the island regions 126-1 in a horizontal plane may be set by the mask 151. For example, in a horizontal cross-section of the buffer layer 126, the island regions 126-1 may exhibit a square shape, a rectangular shape, or a strip shape.

Subsequently to the implantation (step 22-4), the mask 151 may be removed (step 22-5), and the epitaxial growth (step 22) of the buffer layer 126 may be continued (step 22-6).

The island regions 126-1 in the buffer layer 126 produced in this manner may comprise dopants of the second conductivity type. For example, the island regions 126-1 inside the buffer layer 126 may be p-doped island regions 126-1 floating within an n-doped buffer layer 126 of a diode or an IGBT to be produced.

For example, the dopant concentration of the island regions 126-1 within the buffer layer 126 is higher than the dopant concentration of the buffer layer 126 outside the island regions 126-1 by a factor of at least 2. In a variant, the dopant concentration of the island regions 126-1 within the buffer layer 126 is higher than the dopant concentration of the buffer layer 126 outside the island regions 126-1 by a factor of at least 5 or even 10.

For example, the island regions 126-1 inside the buffer layer 126 are configured to inject holes during switching-off of the semiconductor device. For example, the island regions 126-1 inside the buffer layer 126 may thereby counteract against a too early or too sudden break-down of a reverse-recovery current.

FIG. 1G illustrates yet further optional steps of the methods 2 of producing a semiconductor device 1 explained above. In this embodiment, the method 2 further comprises interrupting (step 23-1) epitaxially growing the drift layer 123 at a point, implanting (step 23-2) dopants of the first conductivity type in the portion of the drift layer 123 that has been grown epitaxially up to that point, and, subsequently, continuing (step 23-3) the epitaxial growing 23 of the drift layer 123.

For example, epitaxially growing (step 23) of the drift layer 123 is interrupted for the dopant implantation 23-1 after about half of a final (total) thickness of the drift layer 123 has been reached. Implanting dopants may comprise creating, by implantation, a dopant concentration profile having one or more features described above with regard to creating a dopant concentration profile during the epitaxial growth 23 of the drift layer (see, for example, FIG. 2). For example, a Gaussian-shaped dopant concentration profile may be created in the drift region 123 by implantation. Creating a Gaussian-shaped profile may further comprise a diffusion of the implanted dopants during a subsequent tempering step. For instance, one of selenium, phosphorus, arsenic, and antimony may be used as dopant material for the implantation 23-2.

Alternatively or additionally to creating a dopant concentration profile of dopants of the first conductivity type within the drift layer 123, during the implantation step 23-2, dopants of the second conductivity type may be implanted, e.g., to realize compensation structures according to the superjunction principle. Such an implantation step 23-2 may be carried out as a masked implantation or as an unmasked implantation.

The optional method steps explained above with respect to FIG. 1A to FIG. 1G may be combined for forming further embodiments of the method 2, as long as the respective method steps are not described as being alternative each other.

Figure 4A:
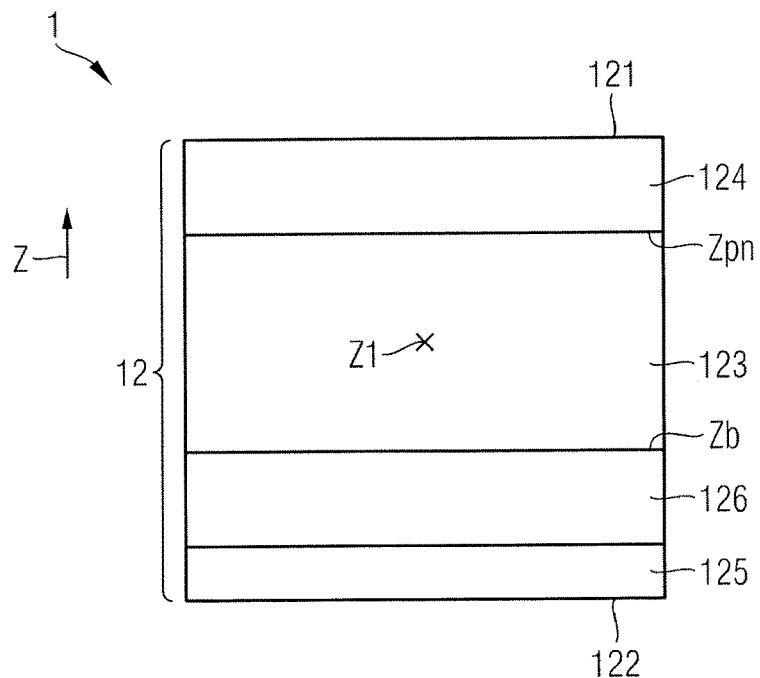
FIG. 4A schematically illustrates a section of a vertical cross-section of a semiconductor device according to one or more embodiments.
Figure 4B:
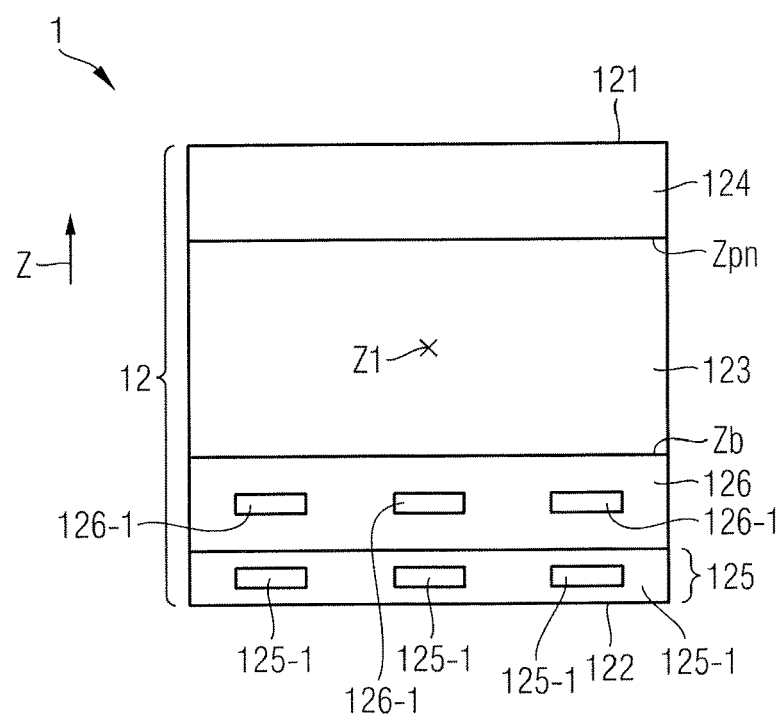
FIG. 4B schematically illustrates a section of a vertical cross-section of a semiconductor device according to one or more embodiments.

FIG. 4A and FIG. 4B each schematically illustrate a section of a vertical cross-section of a semiconductor device 1 according to one or more embodiments. Such a semiconductor device 1 may be produced by carrying out an embodiment of the methods 2 explained above.

As illustrated in FIG. 4A and in FIG. 4B, the semiconductor device 1 includes a semiconductor body 12 having a front side 121 and a back side 122, wherein the semiconductor body 12 extends in a vertical direction Z pointing from the back side 122 to the front side 121.

For example, the semiconductor device 1 is a vertical power semiconductor device 1 and configured to conduct a load current and/or block a voltage between a first and a second load contact of the semiconductor device 1, wherein the first load contact may be electrically connected to the front side 121 of the semiconductor body 12 and the second load contact is electrically connected to the back side 122 of the semiconductor body 12.

In an embodiment, the semiconductor device 1 is one of a diode, an IGBT, and a MOSFET.

The semiconductor body 12 may be grown epitaxially according to the principles described above with respect to FIGS. 1A to 1G. The semiconductor body 12 may thus comprise an epitaxially grown drift layer 123 having dopants of a first conductivity type. For example, the drift layer 123 comprises a drift zone, such as an n$^-$-doped drift zone of a pin-diode, an IGBT or a MOSFET, configured to conduct a current between the front side 121 and the back side 122 of the semiconductor body 12. The drift layer 123 may be grown epitaxially according to the principles described above with respect to FIG. 2. Thus, the above description of examples of the dopant concentration profile P in the drift region 123 (see also FIG. 2) applies likewise to the embodiments of the semiconductor device 1 illustrated in FIGS. 4A and 4B. For example, in the drift layer 123, a dopant concentration profile P along the vertical direction Z can exhibit a variation of the dopant concentration by a factor of at least 2. This factor can be even greater than 2, for example greater than 5, or greater than 10. In another embodiment, a maximum 400 of the dopant concentration profile P in the drift layer 123 is higher than a concentration of dopants of the first conductivity type at the pn-junction Zpn by a factor of at least 2.

A body region 124 having dopants of a second conductivity type complementary to the first conductivity type 124 can be arranged either within or on top of the drift layer 123. For instance, the body region 124 comprises a p-doped anode region of a pin-diode or a p-body region of an n-channel IGBT or of an n-channel MOSFET. A transition between the body region 124 and the drift layer 123 may form a pn-junction Zpn. For example, the pn-junction Zpn is configured to block a voltage between the external load contacts of the semiconductor device 12 with a space charge region extending into the body region 124 and the drift zone 123.

In an embodiment, the body region 124 comprises an epitaxially grown semiconductor layer. For example, the body region 124 has been produced by epitaxial growth, as explained above with respect to FIG. 1A. For instance, the semiconductor device 1 may comprise a vertical edge termination, which may not require a horizontal structuring of the body region 124, thus allowing for producing the body region 124 by epitaxial growth. Alternatively, the body region 124 may have been produced by an implantation or a diffusion of dopants of the second conductivity type into the drift layer 123, as illustrated in FIG. 1C. In this manner, a body region 124 in the form of a well may be produced inside the drift layer 123. For example, the body region 124 may comprise a p-well region 124 of a pin-diode, an n-channel IGBT, or an n-channel MOSFET.

The semiconductor body 12 may further comprise an epitaxially grown back side emitter layer 125 arranged in between the drift layer 123 and the back side 122. The back side emitter layer 125 has dopants of the first and/or dopants of the second conductivity type, wherein a dopant concentration of the back side emitter layer 125 is higher than a dopant concentration of the drift layer 123. In an embodiment, a maximal dopant concentration in the buffer layer 126 is higher than a maximal dopant concentration in the drift layer 123 by a factor of at least 2. For example, the back side emitter layer has been produced by epitaxial growth 21 according to the methods 2 described above.

The back side emitter layer 123 may comprise a back side emitter region of a diode or a drain region of a MOSFET, which can be, for example $n^+$-doped. In further embodiments, the back side emitter layer 123 comprises a back side emitter region of an IGBT, wherein the back side emitter layer can be, for example, $p^+$-doped. As stated above, the dopant concentration of the back side emitter layer 125 may exhibit a lateral variation. For example, in a p-doped back side emitter layer 125 of an IGBT, a dopant concentration underneath an edge termination structure may be lower than a dopant concentration of an active area of the IGBT. In this way, an improved dynamic robustness of the IGBT may be achieved.

In an embodiment, the semiconductor device 1 may further comprise an epitaxially grown buffer layer 126 in contact with the drift layer 123, as shown in FIGS. 4A and 4B. The buffer layer 126 can be arranged in between the drift layer 123 and the back side emitter layer 125 and may have dopants of the first conductivity type at a higher dopant concentration than the drift layer 123. The buffer layer 126 can comprise one or more dopant concentration maxima configured to avoid a punch-through of an electric field to the back side emitter region 123 in a blocking state of the semiconductor device 1. For example, a maximal dopant concentration in the buffer layer 126 is higher than a maximal dopant concentration in the drift layer 123 by a factor of at least 2.

The buffer layer 126 may be grown epitaxially according to the principles described above with respect to FIG. 1B. The above description of examples of a dopant concentration profile Q in the buffer region 126 (as exemplarily illustrated in FIGS. 3A-3D) applies likewise to the embodiments of the semiconductor device 1 illustrated in FIGS. 4A and 4B. For example, the buffer layer 126 comprises a dopant concentration profile Q along the vertical direction Z exhibiting a variation of the dopant concentration by a factor of at least 2. In a further embodiment, a vertical dopant concentration profile Q in the buffer layer 126 comprises at least one of a step-shaped section, a box-shaped section, a substantially linear section, and a plurality of local maxima (see FIGS. 3A-3D).

FIG. 4B illustrates an embodiment of the semiconductor device 1 that comprises a plurality of island regions 125-1 inside the back side emitter layer 125. The island regions 125-1 may comprise dopants of a conductivity type complementary to the conductivity type of the dopants being present within the epitaxially grown emitter layer 125. For example, in a horizontal cross-section of the back side emitter layer 125, the island regions 125-1 may exhibit a square shape, a rectangular shape, a strip shape, or another shape. For example, the semiconductor device 1 is a pin-diode, and the plurality of p-doped island regions 125-1 inside the back side emitter layer 125 are arranged and configured to inject holes during switching-off of the diode, thereby counteracting a too early or too sudden break-down of a reverse-recovery current. The island regions 125-1 may be produced, e.g., according to steps 21-2 to 21-6, as explained above with respect to FIG. 1E. In a variant, the island regions 125-1 may extend through the whole back side emitter layer 125 in the vertical direction Z, thereby being in contact with the back side 122 and the buffer layer 126. For example, in a reverse conducting IGBT, the n-doped island regions 125-1 may be in contact with the buffer layer 126 and with a backside metallization arranged on the back side 122, thereby functioning as n-short areas of the reverse conducting IGBT 1.

Alternatively or additionally, such island regions may be implemented in the buffer layer 126, as also shown in FIG. 4B. For example, the island regions may be p-doped island regions 126-1 floating within an n-doped buffer layer 126 of a diode or of an IGBT. The island regions 126-1 in the buffer layer 126 may, e.g., comprise dopants of the first conductivity type. For example, in a horizontal cross-section of the buffer layer 126, the island regions 126-1 may exhibit a square shape, a rectangular shape, a strip shape, or another shape. For example, the semiconductor device 1 is a pin-diode or an IGBT, and the plurality of p-doped island regions 126-1 inside the buffer layer 126 are arranged and configured to inject holes during switching-off of the semiconductor device 1, thereby counteracting a too early or too sudden break-down of a reverse-recovery current. The island regions 126-1 may be produced, e.g., according to steps 22-2 to 22-6, as explained above with respect to FIG. 1F.

The embodiments described above include the recognition that a substantially soft switch-off behavior of power semiconductor devices, such as diodes, IGBTs and MOSFETs, may be desirable in some applications. At the same time, requirements with regards to a high ruggedness and low switching-losses may need to be considered, e.g., for hard-switching applications operating at high switching frequencies.

In accordance with one or more embodiments, it is proposed to produce both a back side emitter and a drift layer of such a power semiconductor device by epitaxial growth, wherein a vertical dopant concentration profile inside the drift layer exhibits a defined variation of the dopant concentration. The dopant concentration profile comprises, for example, a maximum close to the center of the drift region, thereby enabling a substantially soft switching behavior of the semiconductor device.

In accordance with one or more embodiments, it is further proposed to epitaxially grow a buffer layer on top of the back side emitter layer before growing the drift layer on top of the buffer layer. Epitaxially growing the buffer layer may include creating a vertical dopant concentration profile that exhibits a defined variation of the dopant concentration. For example, the dopant concentration profile in the buffer layer comprises one of a step-shaped section, a box-shaped section, a substantially linear section, and a plurality of local maxima. In accordance with one or more embodiments, a variety of defined dopant concentration profiles in the buffer layer can be produced in this manner, thereby allowing for optimizing the semiconductor device with respect to, e.g., softness, switching losses, and the voltage blocking capability.

In accordance with one or more embodiments, creating a dopant concentration profile inside the drift layer and/or the buffer layer can be achieved by a time dependent admixture of dopants during the epitaxial growth, yielding a relatively precise and reproducible dopant concentration profile as compared to, for instance, a dopant implantation. Furthermore, by creating appropriate vertical dopant concentration profiles in the drift layer and/or the buffer layer, electric fields both at the front side and at the back side of the semiconductor device may be reduced in operation. As a result, the ruggedness of the semiconductor device may be improved considerably.

Producing several or all functional regions of a semiconductor device by epitaxial growth of respective semiconductor layers can have further advantages in terms of, for example, a reduced total thickness variation of the processed semiconductor body, an increased process flexibility and compatibility (e.g., in the choice of substrate materials and wafer diameters), and reduced processing costs.

Features of further embodiments are defined in the dependent claims. The features of further embodiments and the features of the embodiments described above may be combined with each other for forming additional embodiments, as long as said features are not explicitly described as being alternative to each other.

In the above, embodiments pertaining to methods of producing a semiconductor device and, embodiments pertaining to semiconductor devices were explained. For example, these semiconductor arrangements and semiconductor devices are based on silicon (Si). Accordingly, a monocrystalline semiconductor region or layer, e.g., the semiconductor body 12 and the semiconductor regions 123 to 127 of exemplary embodiments, are typically a monocrystalline Si-region or Si-layer.

It should, however, be understood that the semiconductor body 12 and the semiconductor regions 123 to 127 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially local terms such as "under", "below", "lower", "over", "upper" and the like, are used for ease of description to explain the positioning of one element local to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor device including a semiconductor body having a front side and a back side, the semiconductor body extending in a vertical direction pointing from the back side to the front side and comprising:
   an epitaxially grown drift layer having dopants of a first conductivity type;
   a body region arranged either within or on top of the drift layer and having dopants of a second conductivity type complementary to the first conductivity type, a transition between the body region and the drift layer forming a pn-junction;
   an epitaxially grown back side emitter layer arranged in between the drift layer and the back side, the back side emitter layer having dopants of the first or the second conductivity type and having a higher dopant concentration than the drift layer; and
   an epitaxially grown buffer layer in contact with the drift layer, the buffer layer being arranged in between the drift layer and the back side emitter layer and having dopants of the first conductivity type at a higher dopant concentration than the drift layer, wherein a dopant concentration profile of the buffer layer along the vertical direction comprises at least one peak, and the at least one peak comprises a section having a flat doping profile.

2. The semiconductor device of claim 1, wherein a maximum of the dopant concentration profile in the drift layer is higher than a concentration of dopants of the first conductivity type at the pn-junction by a factor of at least 2.

3. The semiconductor device of claim 1, wherein, in the buffer layer, a dopant concentration profile along the vertical direction exhibits a variation of the dopant concentration by a factor of at least 2.

4. The semiconductor device of claim 1, wherein, in the buffer layer, a dopant concentration profile along the vertical direction comprises at least one of a step-shaped section, a box-shaped section, a substantially linear section, and a plurality of local maxima.

5. The semiconductor device of claim 1, wherein the body region comprises an epitaxially grown semiconductor layer.

6. The semiconductor device of claim 1, wherein a full width at half maximum of the dopant concentration profile in the drift layer is at least 20% of the distance from the transition between the body region and the drift layer to a transition between the back side emitter layer and the drift layer.

7. The semiconductor device of claim 1, wherein the flat doping profile is a box-shaped section or a step-shaped section.

8. A semiconductor device including a semiconductor body having a front side and a back side, the semiconductor body extending in a vertical direction pointing from the back side to the front side and comprising:

an epitaxially grown drift layer having dopants of a first conductivity type;

a body region arranged either within or on top of the drift layer and having dopants of a second conductivity type complementary to the first conductivity type, a transition between the body region and the drift layer forming a pn-junction; and an epitaxially grown back side emitter layer arranged in between the drift layer and the back side, the back side emitter layer having dopants of the first or the second conductivity type and having a higher dopant concentration than the drift layer; and an epitaxially grown buffer layer in contact with the drift layer, the buffer layer being arranged in between the drift layer and the back side emitter layer and having dopants of the first conductivity type at a higher dopant concentration than the drift layer, wherein a dopant concentration profile of the buffer layer along the vertical direction comprises at least one peak, and the at least one peak comprises a section having a flat doping profile.

9. The semiconductor device of claim 8, wherein, in the buffer layer, a dopant concentration profile along the vertical direction comprises at least one of a step-shaped section, a box-shaped section, a substantially linear section, and a plurality of local maxima.

10. The semiconductor device of claim 8, wherein the dopant concentration profile in the buffer layer exhibits at least one of a step-like increase and a step-like decrease of the dopant concentration along the vertical direction.

11. The semiconductor device of claim 8, wherein the dopant concentration profile in the buffer layer comprises at least one box-shaped section, wherein a first lateral edge of the at least one box-shaped section comprises a step-like increase of the dopant concentration along the vertical direction, and wherein a second lateral edge of the box-shaped section comprises a step-like decrease of the dopant concentration along the vertical direction.

12. The semiconductor device of claim 11, wherein the dopant concentration varies along the vertical direction by a factor of at least 2 over a distance of 1 μm at the at least one step-like increase and/or at the at least one step-like decrease of the dopant concentration profile.

13. The semiconductor device of claim 8, wherein the dopant concentration profile in the buffer layer comprises at least one linear section exhibiting one of a linear increase and a linear decrease of the dopant concentration along the vertical direction over a distance of at least 10% of the total extension of the buffer layer along the vertical direction.

14. The semiconductor device of claim 8, wherein the dopant concentration profile in the buffer layer exhibits a plurality of local maxima.

15. The semiconductor device of claim 14, wherein the dopant concentration profile in the buffer layer exhibits at least one local minimum being located between two neighboring local maxima of the plurality of local maxima, and wherein a dopant concentration at the local minimum is lower than the dopant concentration of each of the neighboring local maxima by a factor of at least 2.

16. The semiconductor device of claim 8, wherein the epitaxially grown back side emitter layer comprises one or more island regions, the island regions having dopants of the type complementary to the dopant type of the back side emitter layer.

17. The semiconductor device of claim 8, wherein, in the buffer layer, a dopant concentration profile along the vertical direction exhibits a variation of the dopant concentration by a factor of at least 2.

18. A semiconductor device including a semiconductor body having a front side and a back side, the semiconductor body extending in a vertical direction pointing from the back side to the front side and comprising:

an epitaxially grown drift layer having dopants of a first conductivity type;

a body region arranged either within or on top of the drift layer and having dopants of a second conductivity type complementary to the first conductivity type, a transition between the body region and the drift layer forming a pn-junction;

an epitaxially grown back side emitter layer arranged in between the drift layer and the back side, the back side emitter layer having dopants of the first or the second conductivity type and having a higher dopant concentration than the drift layer;

an epitaxially grown buffer layer in contact with the drift layer, the buffer layer being arranged in between the drift layer and the back side emitter layer and having dopants of the first conductivity type at a higher dopant concentration than the drift layer, wherein a first dopant concentration profile of the buffer layer along the vertical direction comprises at least one peak, and the at least one peak comprises a section having a flat doping profile; and wherein the epitaxially grown drift layer comprises a second dopant concentration profile of dopants of the first conductivity type along the vertical direction, the second dopant concentration profile exhibiting a variation of a concentration of dopants of the first conductivity type along the vertical direction.

19. The semiconductor device of claim 18, wherein, in the buffer layer, the dopant concentration profile along the vertical direction exhibits a variation of the dopant concentration by a factor of at least 2.

20. The semiconductor device of claim 18, wherein the flat doping profile is a box-shaped section or a step-shaped section.

* * * * *